United States Patent
Willcock et al.

(10) Patent No.: US 11,314,429 B2
(45) Date of Patent: Apr. 26, 2022

(54) APPARATUSES AND METHODS FOR OPERATIONS USING COMPRESSED AND DECOMPRESSED DATA

(71) Applicant: Micron Technology, Inc., Boise, ID (US)

(72) Inventors: Jeremiah J. Willcock, Boise, ID (US); Perry V. Lea, Eagle, ID (US); Anton Korzh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/529,525

(22) Filed: Aug. 1, 2019

(65) Prior Publication Data

US 2019/0354303 A1    Nov. 21, 2019

Related U.S. Application Data

(63) Continuation of application No. 15/072,147, filed on Mar. 16, 2016, now Pat. No. 10,379,772.

(51) Int. Cl.
*G06F 3/06* (2006.01)
*H04N 19/186* (2014.01)
(Continued)

(52) U.S. Cl.
CPC .......... *G06F 3/0638* (2013.01); *G06F 3/0604* (2013.01); *G06F 3/0647* (2013.01); *G06F 3/0656* (2013.01); *G06F 3/0673* (2013.01); *G06T 1/0007* (2013.01); *G06T 1/60* (2013.01); *G11C 7/1006* (2013.01); *G11C 7/1036* (2013.01); *G11C 11/4091* (2013.01); *G11C 11/4096* (2013.01); *H04N 19/186* (2014.11); *G11C 2207/005* (2013.01); *G11C 2207/102* (2013.01); *G11C 2207/104* (2013.01)

(58) Field of Classification Search
CPC .... G06F 3/0638; G06F 3/0604; G06F 3/0647; H04N 19/186
USPC ........................................................ 345/555
See application file for complete search history.

(56) References Cited

U.S. PATENT DOCUMENTS

| | | |
|---|---|---|
| 4,380,046 A | 4/1983 | Fung |
| 4,419,741 A | 12/1983 | Stewart et al. |

(Continued)

FOREIGN PATENT DOCUMENTS

| | | |
|---|---|---|
| CN | 102141905 | 8/2011 |
| CN | 102637150 | 8/2012 |

(Continued)

OTHER PUBLICATIONS

Whittenburg, "Alpha Blending Graphic Images Combining Images for Special Effects", Dr. Dobb's Journal, Aug. 1995, M&T Publ., Redwood City, CA, US, vol. 20, No. 8, Aug. 1, 1995, pp. 48, 50, 52, 54, 100-101.

(Continued)

*Primary Examiner* — Hai Tao Sun
(74) *Attorney, Agent, or Firm* — Brooks, Cameron & Huesbch, PLLC

(57) ABSTRACT

The present disclosure includes apparatuses and methods for operations using compressed and decompressed data. An example method includes receiving compressed data to a processing in memory (PIM) device and decompressing the compressed data on the PIM device.

18 Claims, 7 Drawing Sheets

(51) Int. Cl.
    *G06T 1/00*         (2006.01)
    *G06T 1/60*         (2006.01)
    *G11C 7/10*         (2006.01)
    *G11C 11/4096*     (2006.01)
    *G11C 11/4091*     (2006.01)

(56) References Cited

U.S. PATENT DOCUMENTS

| | | |
|---|---|---|
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,467,087 A | 11/1995 | Chu |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,706,451 A | 1/1998 | Lightbody et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,057,573 A | 5/2000 | Kirsch et al. |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,704,022 B1 | 3/2004 | Aleksic |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,230,630 B2 * | 6/2007 | Seong ............... G06T 9/001 345/549 |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |

(56) References Cited

U.S. PATENT DOCUMENTS

| | | |
|---|---|---|
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,958,257 B2 | 2/2015 | Yoon |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,158,667 B2 | 10/2015 | Manning |
| 9,165,023 B2 | 10/2015 | Moskovich et al. |
| 9,628,111 B2 | 4/2017 | Henry et al. |
| 9,768,803 B2 | 9/2017 | Henry et al. |
| 9,959,913 B2 | 5/2018 | Manning |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0046485 A1 | 3/2003 | Zitlaw |
| 2003/0167426 A1 | 9/2003 | Slobodnik |
| 2003/0222879 A1 | 12/2003 | Lin et al. |
| 2004/0012599 A1* | 1/2004 | Laws ................. G06T 1/60 345/506 |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0092681 A1* | 5/2006 | Kawakubo ............ G11C 29/12 365/52 |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lad et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0263876 A1 | 11/2007 | De Waal et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0066840 A1 | 3/2009 | Karlov et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0007678 A1 | 1/2010 | Tsai et al. |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0231616 A1* | 9/2010 | Park ................. G09G 3/22 345/690 |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0210048 A1* | 8/2012 | Chang .................. G11C 7/1006 711/103 |
| 2012/0219236 A1* | 8/2012 | Ali .................. G06T 5/002 382/276 |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0107652 A1* | 5/2013 | Yoon ................. G11C 5/025 365/207 |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0137119 A1* | 5/2014 | Hyde ................. G06F 21/56 718/100 |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1* | 1/2015 | Manning ................. G11C 7/06 365/189.07 |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |

(56) References Cited

U.S. PATENT DOCUMENTS

| | | | |
|---|---|---|---|
| 2015/0357021 A1 | 12/2015 | Hush | |
| 2015/0357022 A1 | 12/2015 | Hush | |
| 2015/0357023 A1 | 12/2015 | Hush | |
| 2015/0357024 A1 | 12/2015 | Hush et al. | |
| 2015/0357047 A1 | 12/2015 | Tiwari | |
| 2016/0062672 A1 | 3/2016 | Wheeler | |
| 2016/0062673 A1 | 3/2016 | Tiwari | |
| 2016/0062692 A1 | 3/2016 | Finkbeiner et al. | |
| 2016/0063284 A1 | 3/2016 | Tiwari | |
| 2016/0064045 A1 | 3/2016 | La Fratta | |
| 2016/0064047 A1 | 3/2016 | Tiwari | |
| 2017/0127068 A1* | 5/2017 | Lapicque | H04N 19/85 |

FOREIGN PATENT DOCUMENTS

| | | |
|---|---|---|
| CN | 103003881 | 3/2013 |
| CN | 105027212 | 11/2015 |
| EP | 0214718 | 3/1987 |
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | 201640386 | 11/2016 |
| TW | 201643758 | 12/2016 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Extended European Search Report and Written Opinion for related EP Application No. 17767205.2, dated Sep. 6, 2019, 9 pages.

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MinLoc and MaxLoc", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-in-Memory Chip," Jun. 22-26, 2002, (12 pgs.), ICS '02, retrieved from: http://www.isi.edu/~draper/papers/ics02.pdf.

Adibi, et al., "Processing-in-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for related PCT Application No. PCT/US2017/021758, dated May 24, 2017, 14 pages.

Office Action for related Taiwan Patent Application No. 106108692, dated Jan. 9, 2018, 25 pages.

Lanuzza et al., "Cost-Effective Low-Power Processor-in-Memory-Based Reconfigurable Datapath for Multimedia Applications", Aug. 8, 2005, (6 pgs.), Proceedings of the IEEE International Symposium on Low Power Electronics and Design, San Diego, CA, Aug. 8-10, 2005, pp. 161-166.

Jasionowski et al., "A Processor-in-Memory Architecture for Multimedia Compression", Apr. 1, 2007, (6 pgs.), IEEE Transactions on Very Large Scale Integration (VLSI) Systems, vol. 15, No. 4, pp. 478-483.

Tsiatouhas et al., "New Memory Sense Amplifier Designs in CMOS Technology", Dec. 17, 2000, (4 pgs.), 7th IEEE International Conference on Electronics, Circuits, and Systems, Piscataway, NJ, Dec. 17-20, pp. 19-22.

Communication Pursuant to Article 94(3) EPC for related EP Application No. 17767205.2, dated May 18, 2020, 8 pages.

Office Action for related China Patent Application No. 201780017504.6, dated Feb. 20, 2021, 35 pages.

Communication Pursuant to Article (94)3 EPC for related EP Application No. 17767205.2, dated Sep. 24, 2021, 12 pages.

Kwan et al., "Implementation of DSP-RAM: An Architecture for Parallel Digital Signal Processing in Memory", IEEE Canadian Conference on Electrical and Computer Engineering, May 12-16, 2001, vol. 1, pp. 341-346.

* cited by examiner

213-1

| A | B | NOT OPEN | OPEN TRUE | OPEN INVERT |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

244, 245, 256, 270, 271, 275

213-2

| | | | | | | | | | | |
|---|---|---|---|---|---|---|---|---|---|---|
| FF | 0 | 0 | 0 | 0 | 0 | 0 | 1 | 1 | 1 | ← 276 |
| FT | 0 | 0 | 0 | 1 | 1 | 1 | 0 | 0 | 0 | ← 277 |
| TF | 0 | 0 | 1 | 0 | 0 | 1 | 0 | 0 | 1 | ← 278 |
| TT | 0 | 1 | 0 | 0 | 1 | 0 | 0 | 1 | 0 | ← 279 |
| A | B | A | A*B | A*$\bar{B}$ | A+B | B | AXB | A+$\bar{B}$ | $\overline{AXB}$ | $\bar{B}$ |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

APPARATUSES AND METHODS FOR OPERATIONS USING COMPRESSED AND DECOMPRESSED DATA

PRIORITY INFORMATION

This application is a Continuation of U.S. application Ser. No. 15/072,147 filed on Mar. 16, 2016, which issues as U.S. Pat. No. 10,379,772 on Aug. 13, 2019, the contents of which are incorporated herein by reference.

TECHNICAL FIELD

The present disclosure relates generally to semiconductor memory and methods, and more particularly, to apparatuses and methods for operations using compressed and decompressed data.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and associated functional unit circuitry) may be external to the memory array, and data is accessed via a bus between the processing resources and the memory array to execute a set of instructions. Processing performance may be improved in a processor-in-memory device, in which a processor may be implemented internally and/or near to a memory (e.g., directly on a same chip as the memory array). A processing in memory device may save time by reducing and eliminating external communications and may also conserve power.

BRIEF DESCRIPTION OF THE DRAWINGS

FIG. 2C shows logic tables illustrating selectable logical operation results implemented by sensing circuitry in accordance with a number of embodiments of the present disclosure.

DETAILED DESCRIPTION

Figure 1A:
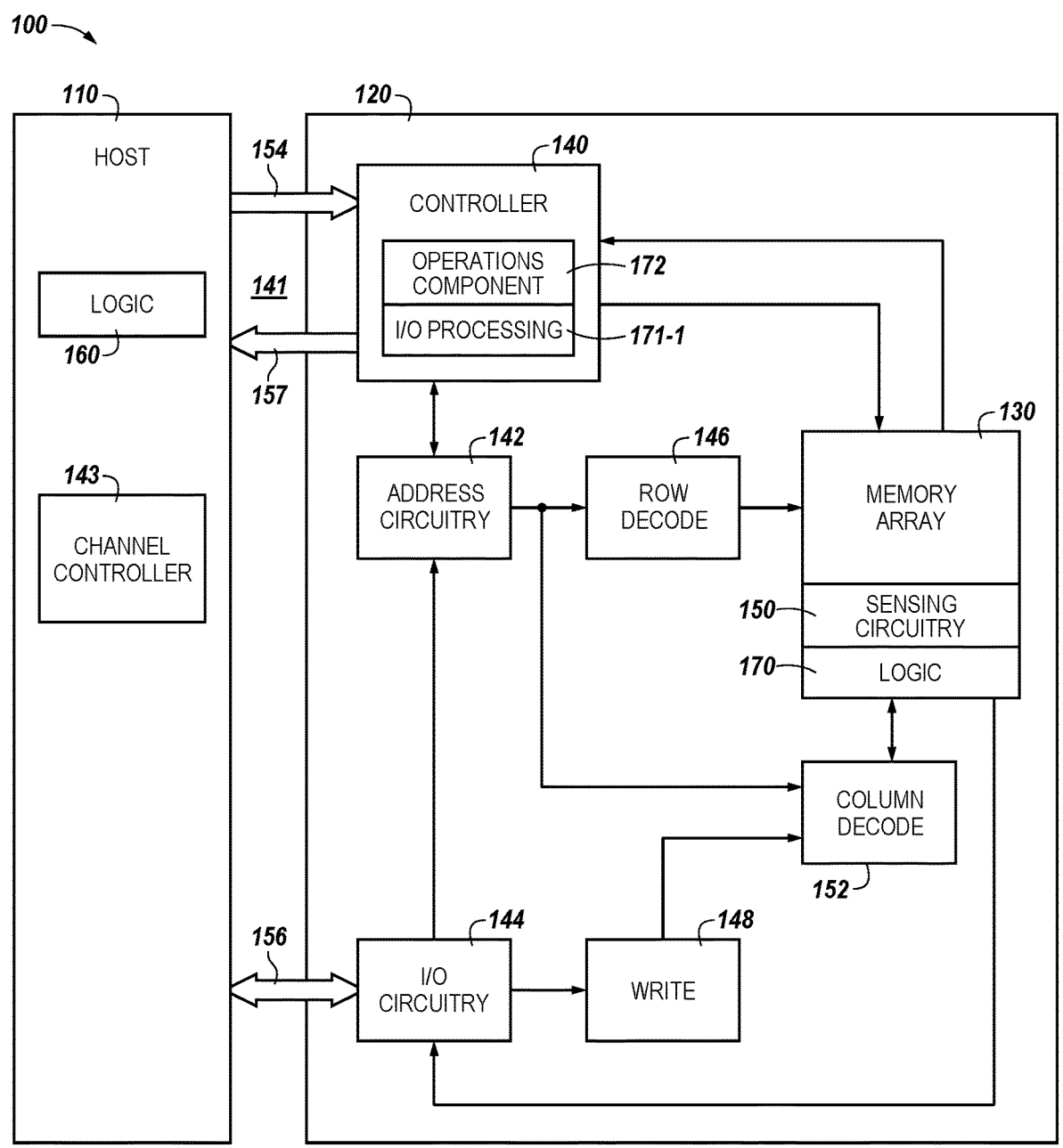
FIG. 1A is a block diagram of an apparatus in the form of a computing system including a memory device in accordance with a number of embodiments of the present disclosure.

The present disclosure includes apparatuses and methods for operations using compressed and decompressed data (e.g., for operations using processing in memory (PIM) structures). In at least one embodiment, a method includes receiving compressed data to a PIM device and decompressing the compressed data on the PIM device.

In previous approaches, data may be transferred from a memory array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate operations. However, transferring data from the memory array and sensing circuitry to such processing resource(s) can involve significant time and/or power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), transferring the data peripheral to the memory array, which may be transfer to a cache in a host, and providing the data to the peripheral compute circuitry (e.g., associated with a central processing unit (CPU) of the host).

Furthermore, the circuitry of the processing resource(s) (e.g., a compute engine) may not conform to pitch rules associated with a memory array. For example, the memory cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure can include the sensing circuitry (e.g., including sense amplifiers and/or compute components) and/or an operations component, as described herein, being formed on pitch with the memory cells of the array and being configured to (e.g., being capable of performing) compute functions (e.g., operations), such as those described herein, on pitch with the memory cells.

For example, the sensing circuitry 150 described herein can be formed on a same pitch as a pair of complementary sense lines. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

Furthermore, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. The data may be processed by a processing resource associated with a host, for instance, rather than on pitch with the memory.

In contrast, a number of embodiments of the present disclosure can include the sensing circuitry 150 (e.g., including sense amplifiers and/or compute components) being formed on pitch with the memory cells of the array. The sensing circuitry 150 can be configured for (e.g., capable of) performing compute functions (e.g., logical operations).

In the context of some computing systems and subsystems (e.g., a CPU, a graphics processing unit (GPU), and/or a frame buffer, etc.), data may be processed in a location that is not on pitch with memory cells in the array and/or corresponding pairs of complementary sense lines and/or on chip with memory (e.g., formed on the same chip as the memory cells in the array) and/or a controller for the memory, as described herein. The data may be processed by a processing resource associated with a host, for instance, rather than on pitch and/or on chip with the memory and/or on chip with the controller. As such, the data may be sent to and from memory in the same format as the data was in before or after being processed elsewhere.

In graphics, for instance, data may be sent in compressed form to a frame buffer. Although imaging coordinates (e.g., textures, depths, etc.) may be stored in memory in compressed form, the memory may then send the compressed data to a GPU in the compressed form, with the GPU responsible for decompressing the data and sending uncompressed data (e.g., which may also have been depth textured and/or depth buffered, as described herein, by the GPU) back to the memory and/or to the frame buffer. Such movement (e.g., copying, transferring, and/or transporting) of data off pitch for processing, including decompression of compressed data, may increase memory bandwidth requirements, which also may increase time, power, and/or cost relative to an ability to perform such operations by sensing circuitry on pitch with the memory array.

A memory device configured for on pitch data processing operations, such as a PIM device, can perform operations on data that have been received (e.g., stored) in its original format, as directed by an operations component (e.g., programmed for bitwise logical operations). PIM capable device operations can use bit vector based operations. As used herein, the term "bit vector" is intended to mean a physically contiguous number of bits on a bit vector memory device (e.g., a PIM device) stored physically contiguous in a row of an array of memory cells. Thus, as used herein a "bit vector operation" is intended to mean an operation that is performed on a bit vector that is a contiguous portion of virtual address space (e.g., used by a PIM device). For example, a row of virtual address space in the PIM device may have a bit length of 16K bits (e.g., corresponding to 16K complementary pairs of memory cells in a DRAM configuration). Sensing circuitry, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element on a single bit of the bit vector of the row of memory cells sensed by the sensing circuitry (e.g., sensed by and/or stored in a sense amplifier paired with the compute component, as described herein).

Among various formats, the data may be stored in a compressed form (e.g., using either a lossy or lossless compression algorithm). For example, image data may be sent to the memory in the form of subsampled YUV compressed data, which reduces resolution of color data compared to standard RGB formats. The memory device itself, as described herein, can decompress the data into another format and can then perform operations on the decompressed data (e.g., alpha blending, as directed by the operations component, among other operations described herein).

Alpha blending as used herein is intended to mean a compositing operation in which one image is combined (e.g., overlaid) with at least one other image and where, through partial or full transparency, an image can, for example, serve as a background image and another can serve as a foreground image. Data also may be received and/or stored at a reduced image size and rescaled to a larger size (e.g., by increasing a number of pixels that the image contains), as directed by the operations component. The operations component can be configured to direct compensation for a reduced bit depth in a received and/or stored image, (e.g., by increasing an 8 bit image having 256 possible colors to a 24 bit image having about 16 million possible colors). The operations component also can be configured to decompress, for example, a highly compressed format (e.g., Joint Photographic Experts Group (JPEG), Moving Pictures Experts Group (MPEG), among other such formats), in addition to other possible operations. As such, the operations component 172 described herein may contribute to an "intelligent frame buffer" (e.g., in combination with the sensing circuitry 150 and/or arrays 130 of memory cells, as shown in and described in connection with FIG. 1A and elsewhere) that can perform the just-described operations, among other operations described herein, on pitch with the array of memory cells in which the data may be stored.

The operations being performed on pitch in association with the intelligent frame buffer may reduce memory traffic, and thus time, power, and/or cost. For example, the memory traffic may be reduced relative to sending the data off pitch to be decompressed (e.g., by a GPU associated with the host). The memory traffic also may be reduced by the operations component being configured to direct operations that affect perceived quality of data output (e.g., alpha blending, among other compositing operations, and operations on texture, depth, etc.), which can convert read-modify-write data movement operations involved with exchange of data between the memory and, for example, a GPU into a one-way movement of data into the memory for processing. Data in a reduced-size format can be sent to a memory device, as described herein, to be expanded into a larger format on pitch with the memory. For example, image data can be stored in a subsampled YUV format and converted to non-subsampled RGB format, as directed by the operations component and performed on pitch. The reformatted image data then can be stored as such in memory and/or can have one or more additional operations performed thereon, as described herein. Using a compressed format for input to memory and/or the memory device being configured to decompress and perform other operations on pitch with the memory may reduce bandwidth requirements into and out of the memory device, thereby increasing performance and/or reducing time, usage of electrical power, and/or cost based on the reduced memory traffic.

As described herein, the embodiments can allow a host system to allocate a number of locations (e.g., sub-arrays (or "subarrays")) and portions of subarrays, in one or more DRAM banks to receive (e.g., store) and/or process data. A host system and/or a controller, as described herein, may perform the address resolution on an entire block of program instructions (e.g., PIM command instructions) and data and direct (e.g., control) allocation, storage, and/or movement (e.g., flow) of data and commands into allocated locations (e.g., subarrays and portions of subarrays) within a destination (e.g., target) bank. Writing data and/or executing commands (e.g., issuing instructions to perform operations, as described herein) may utilize a normal DRAM write path to the DRAM device. As the reader will appreciate, while a DRAM-style PIM device is discussed with regard to examples presented herein, embodiments are not limited to a PIM DRAM implementation.

The memory devices described herein can use a number of controllers for a bank of subarrays, controllers for individual subarrays, and/or controllers for operations components (e.g., each controller being a sequencer, a state machine, a microcontroller, a sub-processor, ALU circuitry, or some other type of controller) to execute a set of instructions to perform an operation on data (e.g., one or more operands). As used herein, an operation can be, for example, a Boolean logical operation (e.g., AND, OR, NOT, NOT, NAND, NOR, and/or XOR) and/or other operations (e.g., invert, shift, arithmetic, statistics, and various operations on image and/or audio files, among many other possible operations). For example, functional unit circuitry may be used to perform the arithmetic operations, such as addition, subtraction, multiplication, and division on operands, via a number of logical operations.

The present disclosure describes enablement of operations (e.g., PIM operations, such as AND, OR, refresh, row copy, shift, add, multiply, decompression, compression, alpha blending, operations affecting texture, depth, etc.) to be performed on data values as received by (e.g., stored in) sensing circuitry and/or memory cells (e.g., when directed by the operations component 172, as described herein). For example, the operations can be performed on data values substantially simultaneously with the data values being received (e.g., at least temporarily stored and/or cached) by sensing circuitry 150 (e.g., a sensing component stripe 124) of a subarray 125 and/or upon subsequent retrieval of the data values as stored in a row 119 of memory cells of the subarray, as shown in and described in connection with FIG. 1C.

Implementations of PIM DRAM architecture may perform processing (e.g., in a sensing component stripe 124) at the level of the sense amplifier 206 and/or compute component 231 (e.g., as shown in and described in connection with FIGS. 2A-2C). Implementations of PIM DRAM architecture may allow a finite number of memory cells to be connected to each sense amplifier (e.g., around 1K or 1024 memory cells). A sensing component stripe may include from around 8K to around 16K sense amplifiers. For example, a sensing component stripe may be configured to couple to an array of 1K rows and around 16K columns. A sensing component stripe can be used as a building block to construct the larger memory. In an array of a memory device, there may, for example, be 64 sensing component stripes, which corresponds to 64 subarrays, as described herein. A bank of memory (e.g., of memory cells in a DRAM array) may, in some embodiments, include 64K rows by 16K columns of DRAM to provide around 1 gigabit of memory. This bank architecture may be divided into 64 subarrays that each have a configuration of 1K rows by 16K columns. Each subarray may, for example, be configured to be coupled to an adjacent 16K sensing component stripe to yield a total of 64 sensing component stripes.

Moreover, the sense amplifiers 206 and/or compute components 231 in a sensing component stripe 124 may be directed by instructions sent from the operations component 172 (e.g., via coupled I/O lines), to perform particular operations on data stored (cached) in the sensing component stripe. A number of factors may influence how an operation is performed in the sensing component stripe 124. Comparative complexity of some operations may affect the choice. For example, Boolean operations (e.g., AND, OR, NOT, NOT, NAND, NOR, and/or XOR) and/or shift operations may be effectively performed using functionality resident in and/or local to the sensing component stripe (e.g., as described in connection with FIGS. 2A-2C), whereas decompression operations, alpha blending operations, etc., may be more effectively performed in combination with retrieval of machine instructions stored in one or more rows of coupled subarrays (e.g., as described in connection with FIG. 3) or elsewhere in connection with the computing system 100 (e.g., the controller 140, the operations component 172, and/or the host 110).

Whereas the sensing circuitry 150 (e.g., sense amplifiers and/or compute components of a sensing component stripe) can be directly coupled to the memory cells of a column of memory cells in a subarray, the operations component 172 may, in some embodiments, not be directly coupled to the memory cells of the subarrays. For example, the operations component 172 described herein can be indirectly coupled to the memory cells of a column via a selectably coupled sensing component stripe and a number of selectably coupled I/O lines.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data", "data units", and "data values" are used interchangeably herein and can have the same meaning, as appropriate to the context.

As described herein, an I/O line can be selectably shared by a plurality of subarrays, rows, and/or particular columns of memory cells via the sensing component stripe coupled to each of the subarrays. For example, the sense amplifier and/or compute component of each of a selectable subset of a number of columns (e.g., eight column subsets of a total number of columns) can be selectably coupled to each of a plurality of shared I/O lines for data values stored (cached) in the sensing component stripe to be moved (e.g., copied, transferred, and/or transported) to each of the plurality of shared I/O lines. The I/O line can, in some embodiments, be further shared by the operations component. Because the singular forms "a", "an", and "the" can include both singular and plural referents herein, for example, "a shared I/O line" can be used to refer to "a plurality of shared I/O lines", unless the context clearly dictates otherwise. Moreover, for example, "shared I/O lines" is an abbreviation of "plurality of shared I/O lines".

The figures herein follow a numbering convention in which the first digit or digits correspond to the figure number and the remaining digits identify an element or component in the figure. Similar elements or components between different figures may be identified by the use of similar digits. For example, 150 may reference element "50" in FIG. 1A, and a similar element may be referenced as 250 in FIG. 2A. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, bank arbiter 145, high speed interface (HSI) 141, memory array 130, sensing circuitry 150, I/O processing component 171, operations component 172, and peripheral sense amplifiers and/or logic 170 might also be separately considered an "apparatus."

System 100 in FIG. 1A includes the host 110 coupled (e.g., connected) to memory device 120, which includes a memory array 130. Host 110 can be a host system such as a personal laptop computer, a desktop computer, a digital camera, a smart phone, or a memory card reader, a digital versatile disc player, a JPEG compressed image, a MPEG compressed audio recording, a MPEG compressed video recording, and/or an audio input (e.g., a soundtrack of a video recording, a live performance, a recording on a compact disc, a vinyl disc, etc.), among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 that can be on the same integrated circuit. The system 100 can be, for instance, a server system and/or a high performance computing (HPC) system and/or a portion thereof. Although the examples shown in FIGS. 1A-1D illustrate a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, among other types of arrays. The array 130 can include memory cells arranged in rows coupled by access lines (which may be referred to herein as word lines or select lines) and columns coupled by sense lines (which may be referred to herein as data lines or digit lines). Although a single array 130 is shown in FIG. 1, embodiments are not so limited. For instance, memory device 120 may include a number of arrays 130 (e.g., a number of banks of DRAM cells, NAND flash cells, etc.).

The memory device 120 can include address circuitry 142 to latch address signals provided over a data bus 156 (e.g., an I/O bus from the host 110) by I/O circuitry 144 (e.g., provided to external ALU circuitry and to DRAM data lines (DQs) via local I/O lines and global I/O lines). As used herein, DRAM DQs can enable input of data to and output of data from a bank (e.g., from and to the controller 140 and/or host 110) via a bus (e.g., data bus 156). During a write operation, voltage and/or current variations, for instance, can be applied to a DQ (e.g., a pin). These variations can be translated into an appropriate signal and stored in a selected memory cell. During a read operation, a data value read from a selected memory cell can appear at the DQ once access is complete and the output is enabled. At other times, DQs can be in state such that the DQs do not source or sink current and do not present a signal to the system. This also may reduce DQ contention when two or more devices (e.g., banks) share the data bus.

Figure 1B:
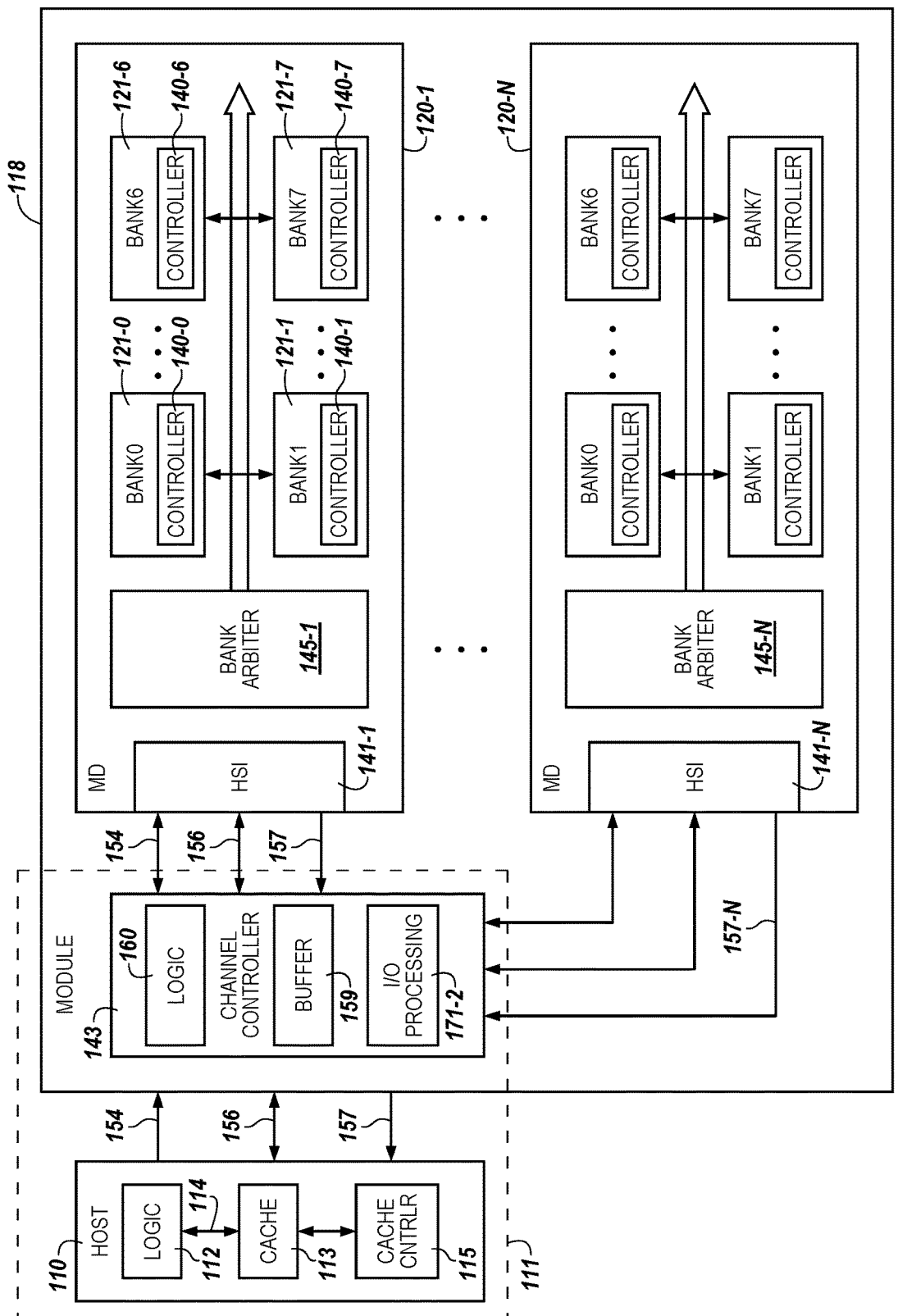
FIG. 1B is another block diagram of an apparatus in the form of a computing system including a memory device in accordance with a number of embodiments of the present disclosure.

Status and exception information can be provided from the controller 140 of the memory device 120 to a channel controller 143, for example, through a high speed interface (HSI) out-of-band (OOB) bus 157, which in turn can be provided from the channel controller 143 to the host 110. The channel controller 143 can include a logic component 160 to allocate a plurality of locations (e.g., controllers for subarrays) in the arrays of each respective bank to store bank commands, application instructions (e.g., for sequences of operations), and arguments (PIM commands) for the various banks associated with operations of each of a plurality of memory devices (e.g., 120-1, . . . , 120-N as shown in FIG. 1B). The channel controller 143 can dispatch commands (e.g., PIM commands) to the plurality of memory devices 120-1, . . . , 120-N to store those program instructions within a given bank of a memory device. The channel controller 143 can, in various embodiments, issue instructions for operations to be stored by the operations component 172 (e.g., as addressed via controller 140) such that the operations component can direct the operations described herein.

Address signals are received through address circuitry 142 and decoded by a row decoder 146 and a column decoder 152 to access the memory array 130. Data can be sensed (read) from memory array 130 by sensing voltage and/or current changes on sense lines (digit lines) using a number of sense amplifiers 206, as described herein, of the sensing circuitry 150. A sense amplifier can read and latch a page (e.g., a row) of data from the memory array 130. Additional compute circuitry, as described herein in connection with the operations component 172, can be coupled to the sensing circuitry 150 and can be used in combination with the sense amplifiers to sense, store (e.g., cache and/or buffer), perform compute functions (e.g., operations), and/or move data. The I/O circuitry 144 can be used for bi-directional data communication with host 110 over the data bus 156 (e.g., a 64 bit wide data bus). The write circuitry 148 can be used to write data to the memory array 130.

Controller 140 (e.g., bank control logic and sequencer) can decode signals (e.g., commands) provided by control bus 154 from the host 110. These signals can include chip enable signals, write enable signals, and/or address latch signals that can be used to control operations performed on the memory array 130, including data sense, data store, data movement (e.g., copying, transferring, and/or transporting data values), data decompression, data write, and/or data erase operations, among other operations described herein. In various embodiments, the controller 140 can be responsible for executing instructions from the host 110 and accessing the memory array 130. The controller 140 can be a state machine, a sequencer, or some other type of controller. The controller 140 can, for example, control performance of Boolean logical operations and/or shifting data (e.g., right or left) in a row of an array (e.g., memory array 130).

Examples of the sensing circuitry 150 are described further below (e.g., in connection with FIGS. 2A-2C). For instance, in a number of embodiments, the sensing circuitry 150 can include a number of sense amplifiers 206 and a number of compute components 231, which may serve as an accumulator and can be used to perform operations in each subarray (e.g., on data associated with complementary sense lines). In some embodiments, a compute component 231 can be coupled to each sense amplifier 206 within the sensing circuitry 150 in each respective sensing component stripe coupled to a subarray (e.g., in sensing component stripes 124-0 and 124-1 coupled respectively to subarrays 125-0 and 125-1). However, embodiments are not so limited. For example, in some embodiments, there may not be a 1:1 correlation between the number of sense amplifiers and compute components (e.g., there may be more than one sense amplifier per compute component or more than one compute component per sense amplifier, which may vary between subarrays, banks, etc.).

In a number of embodiments, the sensing circuitry 150 can be used to perform on pitch operations using data stored in memory array 130 as input and participate in movement of the data for copy, transfer, transport, writing, logic, and/or storage operations to a different location in the memory array 130 without transferring the data via a sense line address access (e.g., without firing a column decode signal). As such, various compute functions may, in some embodiments, be performed on pitch using, and within, sensing circuitry 150 rather than (or in association with) being performed by processing resources external to the sensing circuitry 150 (e.g., by a processor associated with host 110 and/or other processing circuitry, such as ALU circuitry, located on device 120, such as on controller 140 or elsewhere).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines.

In contrast, in a number of embodiments of the present disclosure, sensing circuitry 150 is configured to perform operations on data stored in memory array 130 and store the result back to the memory array 130 without enabling an I/O line (e.g., a local I/O line) coupled to the sensing circuitry 150. The sensing circuitry 150 may be formed on pitch with the memory cells of the array. The operations component 172 can be coupled to the sensing circuitry 150 (e.g., via an I/O line), but may be distinct from the sensing circuitry 150. The memory array 130, the sensing circuitry 150, and the operations component 172, in various embodiments, can cooperate in performing operations, according to embodiments described herein, and can collectively be termed an intelligent frame buffer. Additional peripheral sense amplifiers and/or logic 170 (e.g., subarray controllers that each execute instructions for performing a respective operation) can, in some embodiments, be coupled to the memory array 130, the sensing circuitry 150, and/or the operations component 172. The peripheral sense amplifiers and/or logic 170 can cooperate with and/or be part of the intelligent frame buffer in performance of some operations described herein.

As such, in a number of embodiments, circuitry external to array 130, sensing circuitry 150, and operations component 172 is not needed to perform compute functions because the sensing circuitry 150 and/or the operations component 172 can perform the appropriate operations to perform such compute functions without the use of an external processing resource. Therefore, the sensing circuitry 150 and operations component 172 may be used to complement or to replace, at least to some extent, such an external processing resource (or at least reduce the bandwidth consumption of transfer of data to and/or from such an external processing resource).

However, in a number of embodiments, the sensing circuitry 150 and operations component 172 may be used to perform operations (e.g., to execute instructions) in addition to operations performed by an external processing resource (e.g., host 110). For instance, host 110 and/or sensing circuitry 150 and operations component 172 each may be limited to performing only certain operations and/or a certain number of operations.

Enabling an I/O line can include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry 150 can be used to perform operations without enabling column decode lines of the array. However, the local I/O line(s) may be enabled in order to transfer a result to a suitable location other than back to the array 130 (e.g., to an external register).

FIG. 1A can represent an apparatus architecture in the form of a computing system 100 including a memory device 120 having a plurality of banks (e.g., 121-0, . . . , 121-N as shown in FIG. 1B) coupled to the host 110 via the channel controller 143. In at least one embodiment, the channel controller 143 may be coupled to and integrated with the plurality of banks of the memory device 120 and/or the channel controller 143 may be coupled to and integrated with the host 110. The channel controller 143 can be coupled to each of the plurality of banks of the memory device via an address and control (A/C) bus 154, which in turn can be coupled to the host 110. The channel controller 143 can also be coupled to each of the plurality of banks via a combined data bus 156, which in turn can be coupled to the host 110. In addition, the channel controller 143 can be coupled to each of the plurality of banks via an OOB bus 157 associated with the HSI 141, also referred to herein as a status channel interface, which is configured to report status, exception and other data information to the channel controller 143 to exchange with the host 110.

As shown in FIG. 1A, the channel controller 143 can receive the status and exception information from the HSI 141. In some embodiments, for example, when there are a plurality of banks, the HSI 141 may be associated with a bank arbiter that is associated with each of the plurality of banks (e.g., as shown and described in FIG. 1B for bank arbiter 145-1 associated with banks 121-0, . . . , 120-7). When there is a single bank, a bank arbiter may not be included. Such a bank arbiter can sequence control and data with the plurality of banks (e.g., Bank zero (0), Bank one (1), . . . , Bank six (6), Bank seven (7), etc., as shown in FIG. 1B). A controller 140 can be associated with each particular bank (e.g., Bank 0, . . . , Bank 7) in a given memory device 120 and can decode signals provided by control bus 154 from the host 110. Each of the plurality of banks can include the controller 140 and an I/O processing component 171-1 that, in some embodiments, can be associated with the controller 140 to process input of data of various types to an appropriate bank, bank section, and/or subarray and/or output of such data, for example, to an appropriate destination subsequent to performance of the operations described herein. Alternatively or in addition, the I/O processing component 171-1 can be configured to, for example, perform functions (e.g., operations) consistent with the functions performed by a CPU and/or GPU to coordinate output from memory 130, the sensing circuitry 150, and/or the operations component 172 to provide a product (e.g., static images, video images, and/or audio files, etc.) suitable for video and/or audio output. Each of the plurality of banks also can include other components, including an array of memory cells 130 and sensing circuitry 150, the operations component 172, etc.

For example, each of the plurality of banks (e.g., banks 121-0, 121-1, . . . , 121-7 in a plurality of memory devices 120-1, 120-2, . . . , 120-N as shown in FIG. 1B) can include address circuitry 142 to latch address signals provided over a portion of a combined data bus 156 (e.g., an I/O bus) through I/O circuitry 144. Status and/or exception information can be provided from a controller 140 associated with (e.g., on chip with) each bank to the channel controller 143, using the OOB bus 157, which in turn can be provided from the plurality of banks to the host 110. For each of the plurality of banks (e.g., Bank 0, . . . , Bank 7), address signals can be received through address circuitry 142 and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status and/or exception information to the channel controller 143.

In some embodiments, the channel controller 143 can dispatch commands to the plurality of banks (e.g., Bank 0, . . . , Bank 7) and field return results and/or data from such operations. The return results and/or data can be returned to the channel controller 143 via the OOB bus 157 associated with the status channel interface on each of the plurality of banks.

Embodiments described herein provide a method for operating a memory device 120 to implement operations using compressed and decompressed data. The operations may be performed by execution of non-transitory instructions (e.g., from operations component 172) by a processing resource (e.g., sensing circuitry 150 in sensing component stripes 124-0, 124-1, . . . , 124-N−1). The method can include receiving compressed data to a PIM device and decompressing the compressed data on the PIM device.

As described herein, the compressed data can be received to an intelligent frame buffer on the PIM device. In various embodiments, the intelligent frame buffer can include an operations component 172 and sensing circuitry 150 associated with an array 130 of memory cells, as described herein. For example, the compressed data can be received to (e.g., at least temporarily stored and/or cached in) sensing circuitry 150 associated with a DRAM array on the PIM device.

The compressed data can, in some embodiments, be image data received in, for example, a subsampled YUV image format. The subsampled YUV image format can be received to (e.g., at least temporarily stored and/or cached in) the intelligent frame buffer associated with a random access memory (RAM) array of memory cells on the PIM device. The compressed data can be decompressed by, for example, converting the subsampled YUV image format to a non-subsampled RGB image format using the intelligent frame buffer on the PIM device.

In some embodiments, the method can include storing an image in, for example, the non-subsampled RGB image format to the RAM array. The method can include compositing a plurality of images in the non-subsampled RGB image format into a different image using an alpha blending technique (e.g., in which a first image may be overlaid with at least a second image to form a composite image, as described further herein). The image data may, for example, be received as having a reduced bit depth compared to a bit depth stored on and/or sent from a host 110, as described further herein. The image data may, for example, be received in JPEG format to the intelligent frame buffer on the PIM device. Alpha blending and/or other compositing operations, rescaling, depth texturing, and/or depth buffering, among other possible operations, can be performed on the decompressed data using the sensing circuitry 150 of the intelligent frame buffer associated with, for example, the DRAM array on the PIM device.

Compressed data can, in some embodiments, be received into (e.g., stored in) selected memory cells of an array 130 of the memory cells. The method can, in some embodiments, include decompressing the compressed data to produce decompressed data using the sensing circuitry 150 selectably coupled to the selected memory cells. In some embodiments, the sensing circuitry 150 may be on pitch with the selected memory cells. The method can include directing decompression of the compressed data using an operations component 172 selectably coupled via the sensing circuitry 150 to data values stored in the selected memory cells of the array 130. In some embodiments, the operations component 172 can be associated with a controller 140 on a bank 121 of the array 130.

FIG. 1B is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment, the channel controller 143 may be coupled to the plurality of memory devices 120-1, . . . , 120-N in an integrated manner in the form of a module 118 (e.g., formed on same chip with the plurality of memory devices 120-1, . . . , 120-N). In an alternative embodiment, the channel controller 143 may be integrated with the host 110, as illustrated by dashed lines 111 (e.g., formed on a separate chip from the plurality of memory devices 120-1, . . . , 120-N).

As indicated in FIG. 1B, an I/O processing component 171-2 can, in some embodiments, be associated with the channel controller 143 to process input of data of various types to an appropriate memory device, bank, bank section, and/or subarray and/or output of such data, for example, to an appropriate destination subsequent to performance of the operations described herein. For example, particular (e.g., different) memory devices, banks, bank sections, and/or subarrays may be more appropriate (e.g., based upon particular programming of operations components thereof) for processing of (e.g., directing performance of operations on) static images (e.g., digital photographs), video images (e.g., a video camera recording), audio recordings (e.g., music), among other types of data input. Alternatively or in combination, the I/O processing component 171-2 can be configured to perform functions (e.g., operations) consistent with the functions performed by a CPU and/or GPU to contribute to output from memory, sensing component stripes, and/or operations components to provide a product (e.g., static images, video images, and/or audio files, etc.) suitable for video and/or audio output.

As shown in FIG. 1B, the channel controller 143 can receive the status and/or exception information from a HSI 141 (also referred to herein as a status channel interface) associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks (e.g., Bank 0, . . . , Bank 7, etc.). Each of the plurality of banks can include a controller 140 and other components, including an array of memory cells 130 and sensing circuitry 150, operations component 172, etc., as described in connection with FIG. 1A.

The channel controller 143 can include one or more local buffers 159 to store program instructions and can include logic 160 to allocate a plurality of locations (e.g., subarrays or portions of subarrays) in the arrays of each respective bank to store bank commands, and arguments (e.g., PIM commands) for the various banks associated with operation of each of the plurality of memory devices 120-1, . . . , 120-N. The channel controller 143 can dispatch commands (e.g., PIM commands) to the plurality of memory devices 120-1, . . . , 120-N to store those program instructions within a given bank of a memory device.

As in FIG. 1A, a controller 140 (e.g., bank control logic and/or sequencer) associated with any subarray in a particular bank (e.g., Bank 0, . . . , Bank 7, etc.) in a given memory device (e.g., 120-1, . . . , 120-N) can decode signals provided by control bus 154 from the host 110. These signals can include chip enable signals, write enable signals, and/or address latch signals that are used to control operations performed on the memory array 130, including data read, data write, data copy, data movement, and/or data erase operations. In various embodiments, the controller 140 is responsible for executing instructions from the host 110.

Figure 1C:
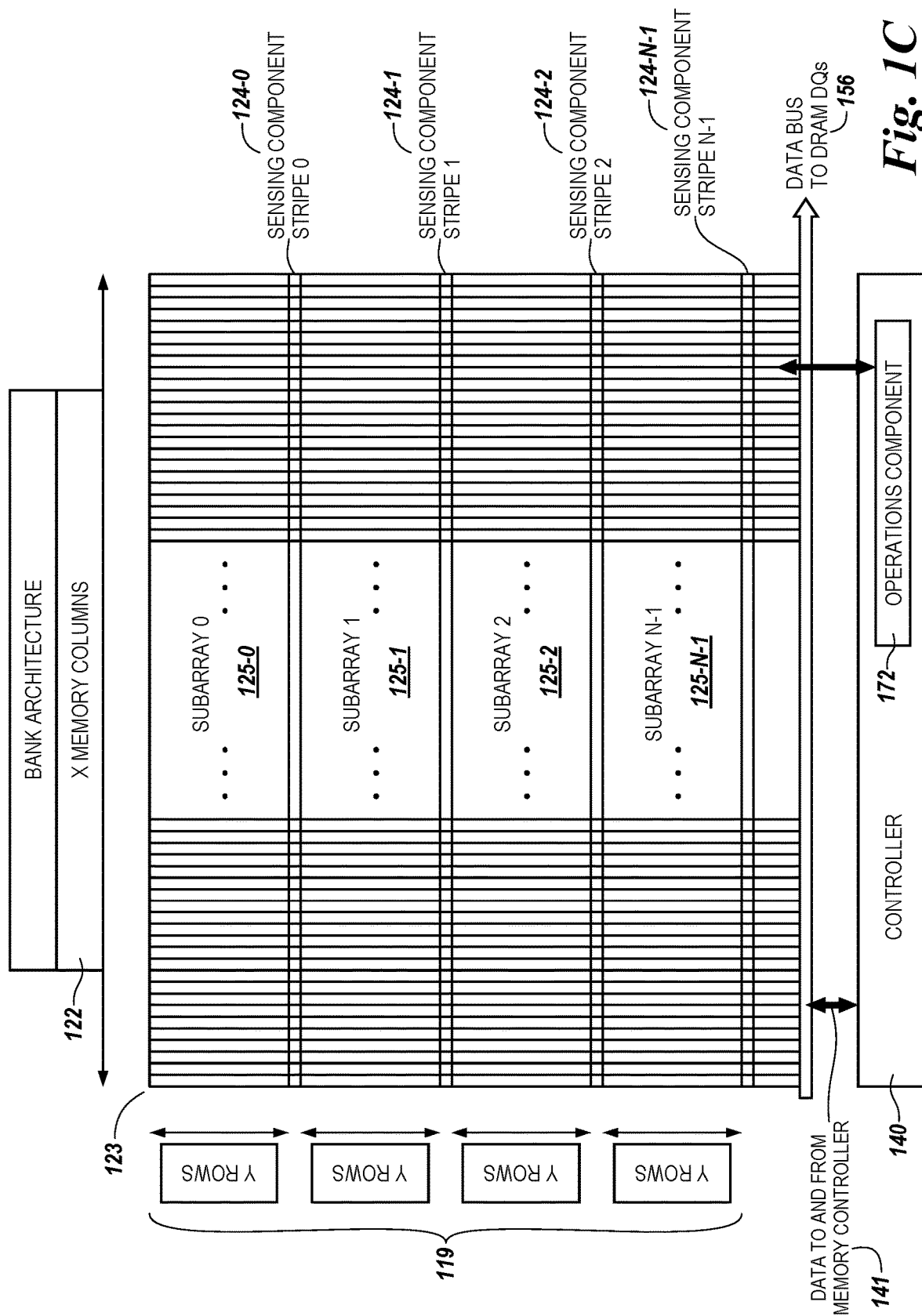
FIG. 1C is a block diagram of a bank section of a memory device in accordance with a number of embodiments of the present disclosure.

FIG. 1C is a block diagram of a bank section 123 of a memory device in accordance with a number of embodiments of the present disclosure. For example, bank section 123 can represent an example section of a number of bank sections of a bank of a memory device (e.g., bank section 0, bank section 1, . . . , bank section M−1). As shown in FIG. 1C, a bank section 123 can include a plurality of memory columns 122 shown horizontally as X (e.g., 4096, 8192, or 16,384 columns, among various possibilities, in an example DRAM bank and bank section). Additionally, the bank section 123 may be divided into subarray 0, subarray 1, . . . , and subarray N−1 (e.g., 32, 64, or 128 subarrays, among various possibilities) shown at 125-0, 125-1, . . . , 125-N−1, respectively, that are separated by amplification regions configured to be coupled to a data path. As such, the subarrays 125-0, 125-1, . . . , 125-N−1 can each have amplification regions 124-0, 124-1, . . . , 124-N−1 that correspond to sensing component stripe 0, sensing component stripe 1, . . . , and sensing component stripe N−1, respectively.

Each column 122 is configured to be coupled to sensing circuitry 150, as described in connection with FIG. 1A and elsewhere herein. As such, each column in a subarray can be coupled individually to a sense amplifier 206 and/or compute component 231 that contribute to a sensing component stripe 124 for that subarray 125. For example, as shown in FIG. 1C, the bank section 123 can include sensing component stripe 0, sensing component stripe 1, . . . , sensing component stripe N−1 that each have sensing circuitry 150 with sense amplifiers that can, in various embodiments, be used as registers, cache and/or data buffering and that are coupled to each column 122 in the subarrays 125-0, 125-1, . . . , 125-N−1.

Each of the of the subarrays 125-0, 125-1, . . . , 125-N−1 can include a plurality of rows 119 shown vertically as Y (e.g., each subarray may include 256, 512, 1024 rows, among various possibilities, in an example DRAM bank). Example embodiments are not limited to the example horizontal and vertical orientation of columns and rows described herein or the example numbers thereof. The sense amplifiers 206 used in sensing data values in memory cells of the subarrays 125 and/or the compute components 231 used in performance of compute operations are located in the plurality of sensing component stripes 124 that are each physically associated with a subarray 125 of memory cells in the bank section 123 shown in FIG. 1C.

In contrast, the operations component 172 configured to direct operations performed on the data values may, in some embodiments, be located on a periphery of the bank section 123. For example, whereas the operations component 172 may, in various embodiments, be located on chip with memory (e.g., formed on the same chip as the memory cells in the array) and/or a controller 140 for the memory, as described herein, the operations component 172 may not be physically associated with a subarray 125 of memory cells, as shown in FIGS. 1A and 1C. Each bank (e.g., banks 121-0, . . . , 121-7 shown in FIG. 1B) of the memory array 130 may, in some embodiments, be configured to include an operations component 172. In some embodiments, a controller 140 with which the operations component 172 is associated may be located in the same bank (e.g., on chip) with the operations component 172. Alternatively, the controller 140 and/or the operations component 172 may be located elsewhere (e.g., in a different bank 121, in a different memory device 121, and/or in association with the host 110).

As shown in FIG. 1C, the bank section 123 can be associated with controller 140. The controller 140 shown in FIG. 1C can, in various examples, represent at least a portion of the functionality embodied by and contained in the controllers 140 shown in FIGS. 1A and 1B. The controller 140 (e.g., which may serve as a source, as described herein) can direct (e.g., control) input of commands and data 141 to the section 123 and output (e.g., movement) of data from the bank section 123 (e.g., to the host 110) along with control of data movement in the section 123 in combination with the operations component 172, as described herein. The bank section 123 can include a data bus 156 (e.g., a 64 bit wide data bus) to DRAM DQs, which can correspond to the data bus 156 described in connection with FIG. 1A. Each data bus 156 for each bank (e.g., 121-0, . . . , 121-7) of subarrays (e.g., 125-0, 125-1, . . . , 125-N–1) can be referred to as a portion of a data bus that contributes to formation of a combined data bus (e.g., as described in connection with FIG. 1B for a plurality of banks and/or memory devices). As such, in some embodiments, eight 64 bit wide data bus portions for eight banks can contribute to a 512 bit wide combined data bus, although embodiments are not so limited.

Figure 2A:
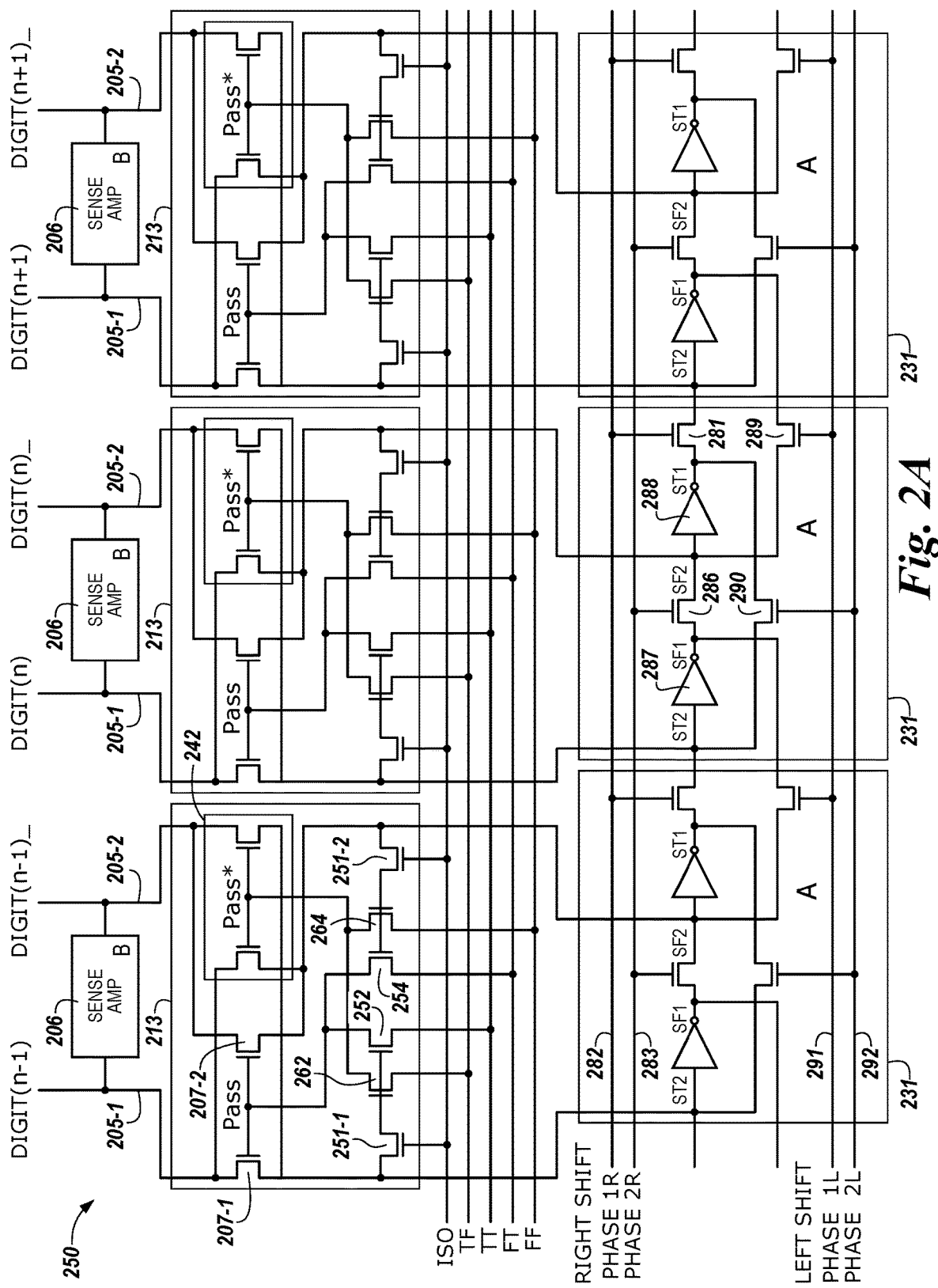
FIGS. 2A and 2B are schematic diagrams illustrating sensing circuitry in accordance with a number of embodiments of the present disclosure.

FIG. 2A is a schematic diagram illustrating sensing circuitry 250 in accordance with a number of embodiments of the present disclosure. The sensing circuitry 250 can correspond to sensing circuitry 150 shown in FIG. 1A.

FIG. 2A shows a number of sense amplifiers 206 coupled to respective pairs of complementary sense lines 205-1 and 205-2, and a corresponding number of compute components 231 coupled to the sense amplifiers 206 via pass gates 207-1 and 207-2. The sense amplifiers 206 and compute components 231 shown in FIG. 2A can correspond to sensing circuitry 150 shown in FIG. 1A and/or the sensing circuitry 250 associated with the plurality of sensing component stripes 124 shown in FIG. 1B, for example. The sensing circuitry 250 shown in FIG. 2A includes logical operation selection logic 213, which can be operated as described further herein.

Although not shown, memory cells are coupled to the pairs of complementary sense lines 205-1 and 205-2 (e.g., columns). For example, a memory cell can comprise a transistor and a capacitor. The memory cells can be, for example, 1T1C DRAM cells each comprising a storage element (e.g., capacitor) and an access device (e.g., transistor), although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell may be refreshed after being read). The cells of the memory array can be arranged in rows coupled by word lines and columns coupled by pairs of complementary data lines DIGIT(n–1)/DIGIT(n–1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pairs of complementary data lines (e.g., three columns) are shown in FIG. 2A, embodiments of the present disclosure are not so limited. For example, an array of memory cells can include additional columns of memory cells and/or data lines (e.g., 4,096, 8,192, 16,384, etc.).

Memory cells can be coupled to different data lines and/or word lines. For example, a first source/drain region of an access transistor of a memory cell can be coupled to a data line 205-1 (D), a second source/drain region of the access transistor of the memory cell can be coupled to a capacitor of the memory cell, and a gate of the access transistor of the memory cell can be coupled to a word line of the memory array.

As shown in FIG. 2A, the sensing circuitry 250 can comprise a sense amplifier 206, a compute component 231, and logical operation selection logic 213 corresponding to respective columns of memory cells (e.g., coupled to respective pairs of complementary data lines). The sense amplifier 206 can comprise, for example, a cross coupled latch, which can be referred to herein as a primary latch. The sense amplifiers 206 can be configured, for example, as described with respect to FIG. 2B.

In the example illustrated in FIG. 2A, the circuitry corresponding to compute components 231 is configured as a loadable shift register. For example, each compute component 231 comprises a latch, which may be referred to herein as a secondary latch, and an additional number of transistors operable to move (e.g., shift) data units right and/or left (e.g., to a latch of an adjacent compute component 231). In a number of embodiments, the latch of the compute component 231 can serve as an accumulator. As such, the compute component 231 can operate as and/or may be referred to herein as an accumulator.

The gates of the pass gates 207-1 and 207-2 can be controlled by a logical operation selection logic signal, Pass. For example, an output of the logical operation selection logic 213 can be coupled to the gates of the pass gates 207-1 and 207-2, as shown in FIG. 2A.

The sensing circuitry 250 illustrated in FIG. 2A also shows logical operation selection logic 213 coupled to a number of logic selection control input control lines, including ISO, TF, TT, FT, and FF. Selection of a logical operation from a plurality of logical operations is determined from the condition of logic selection control signals on the logic selection control input control lines, as well as the data units present on the pairs of complementary sense lines 205-1 and 205-2 when the isolation transistors (e.g., 251-1 and 251-2) are enabled via an ISO control signal being activated.

In various embodiments, the logical operation selection logic 213 can include four logic selection transistors: logic selection transistor 262 coupled between the gates of the swap transistors 242 and a TF signal control line, logic selection transistor 252 coupled between the gates of the pass gates 207-1 and 207-2 and a TT signal control line, logic selection transistor 254 coupled between the gates of the pass gates 207-1 and 207-2 and a FT signal control line, and logic selection transistor 264 coupled between the gates of the swap transistors 242 and a FF signal control line. Gates of logic selection transistors 262 and 252 are coupled to the true sense line through isolation transistor 251-1 (having a gate coupled to an ISO signal control line). Gates of logic selection transistors 264 and 254 are coupled to the complementary sense line through isolation transistor 251-2 (also having a gate coupled to an ISO signal control line).

Data units present on the pair of complementary sense lines 205-1 and 205-2 can be loaded into the compute component 231 via the pass gates 207-1 and 207-2. When the pass gates 207-1 and 207-2 are OPEN, data units on the pair of complementary sense lines 205-1 and 205-2 are passed to the compute component 231 and thereby loaded into the loadable shift register. The data unit on the pair of complementary sense lines 205-1 and 205-2 can be the data unit stored at least temporarily in the sense amplifier 206 when the sense amplifier is enabled (e.g., fired). The logical operation selection logic signal, Pass, is activated to OPEN (e.g., turn on) the pass gates 207-1 and 207-2.

The ISO, TF, TT, FT, and FF control signals can operate to select a logical operation to implement based on the data unit ("B") in the sense amplifier 206 and the data unit ("A") in the compute component 231 (e.g., as used herein, the data unit stored in a latch of a sense amplifier is referred to as a "B" data unit, and the data unit stored in a latch of a compute component is referred to as an "A" data unit). In particular, the ISO, TF, TT, FT, and FF control signals are configured to select the logical operation (e.g., function) to implement independent from the data unit present on the pair of complementary sense lines 205-1 and 205-2 (although the result of the implemented logical operation can be dependent on the data unit present on the pair of complementary sense lines 205-1 and 205-2). For example, the ISO, TF, TT, FT, and FF control signals can select the logical operation to implement directly because the data unit present on the pair of complementary sense lines 205-1 and 205-2 is not passed through logic to operate the gates of the pass gates 207-1 and 207-2.

Additionally, FIG. 2A shows swap transistors 242 configured to swap the orientation of the pair of complementary sense lines 205-1 and 205-2 between the sense amplifier 206 and the compute component 231. For example, when the swap transistors 242 are OPEN (e.g., turned on), data units on the pair of complementary sense lines 205-1 and 205-2 on the sense amplifier 206 side of the swap transistors 242 are oppositely-coupled to the pair of complementary sense lines 205-1 and 205-2 on the compute component 231 side of the swap transistors 242, and thereby loaded into the loadable shift register of the compute component 231 in a complementary manner.

As an example, the logical operation selection logic signal Pass can be activated (e.g., high) to OPEN (e.g., turn on) the pass gates 207-1 and 207-2 when the ISO control signal line is activated and either the TT control signal is activated (e.g., high) with the data unit on the true sense line being "1" or the FT control signal is activated (e.g., high) with the data unit on the complement sense line being "1."

The data unit on the true sense line being a "1" OPENs logic selection transistors 252 and 262. The data unit on the complementary sense line being a "1" OPENs logic selection transistors 254 and 264. If the ISO control signal or either the respective TT/FT control signal or the data unit on the corresponding sense line (e.g., sense line to which the gate of the particular logic selection transistor is coupled) is not high, then the pass gates 207-1 and 207-2 will not be OPENed by a particular logic selection transistor.

The logical operation selection logic signal Pass* can be activated (e.g., high) to OPEN (e.g., turn on) the swap transistors 242 when the ISO control signal line is activated and either the TF control signal is activated (e.g., high) with data unit on the true sense line being "1," or the FF control signal is activated (e.g., high) with the data unit on the complement sense line being "1." If either the respective control signal or the data unit on the corresponding sense line (e.g., sense line to which the gate of the particular logic selection transistor is coupled) is not high, then the swap transistors 242 will not be OPENed by a particular logic selection transistor.

The sensing circuitry 250 illustrated in FIG. 2A is configured to select one of a plurality of logical operations to implement directly from the four logic selection control signals (e.g., logical operation selection is not dependent on the data unit present on the pair of complementary sense lines). Some combinations of the logic selection control signals can cause both the pass gates 207-1 and 207-2 and swap transistors 242 to be OPEN (e.g., conducting) at the same time, which shorts the pair of complementary sense lines 205-1 and 205-2 together. According to a number of embodiments of the present disclosure, the logical operations which can be implemented by the sensing circuitry 250 illustrated in FIG. 2A can be the logical operations summarized in the logic tables shown in FIG. 2C.

Although not shown in FIG. 2A, each column of memory cells can be coupled to a column decode line that can be activated to move, via a local I/O line, a data unit from a corresponding sense amplifier 206 and/or compute component 231. The data unit may be moved (e.g., transferred) to a control component external to the array, such as an external processing resource (e.g., host processor and/or other functional unit circuitry) and/or to an I/O processing component 171, which may be on chip or off chip relative to the sensing circuitry 250. The column decode line can be coupled to a column decoder (e.g., column decoder 152 in FIG. 1A). However, as described herein, in a number of embodiments, data need not be transferred via such I/O lines to perform logical operations in accordance with embodiments of the present disclosure. In a number of embodiments, shift circuitry can be operated in conjunction with sense amplifiers 206 and compute components 231 to perform shift operations without transferring data to a control component external to the array, for example. As used herein, transferring data, which may also be referred to as moving data is an inclusive term that can include, for example, copying data from a source location to a destination location and/or moving data from a source location to a destination location without necessarily maintaining a copy of the data at the source location.

As noted above, the compute components 231 can comprise a loadable shift register. In this example, each compute component 231 is coupled to a corresponding pair of complementary data lines 205-1/205-2, with a node ST2 being coupled to the particular data line (e.g., DIGIT(n)) communicating a "true" data unit and with node SF2 being coupled to the corresponding complementary data line (e.g., DIGIT(n)_) communicating the complementary data unit (e.g., "false" data unit).

In this example, the loadable shift register comprises a first right-shift transistor 281 of a particular compute component 231 having a gate coupled to a first right-shift control line 282 (e.g., PHASE 1R), and a second right-shift transistor 286 of the particular compute component 231 having a gate coupled to a second right-shift control line 283 (e.g., PHASE 2R). Node ST2 of the particular control component is coupled to an input of a first inverter 287, whose output (e.g., node SF1) is coupled to a first source/drain region of transistor 286. The second source/drain region of transistor 286 is coupled to the input (e.g., node SF2) of a second inverter 288. The output (e.g., node ST1) of inverter 288 is coupled to a first source/drain region of transistor 281, and a second source/drain region of transistor 281 the particular compute component 231 is coupled to an input (e.g., node ST2) of a first inverter 287 of an adjacent compute component 231. The loadable shift register shown in FIG. 2A includes a first left-shift transistor 289 coupled between node SF2 of a particular compute component and node SF1 of an adjacent compute component 231. The loadable shift register shown in FIG. 2A also includes a second left-shift transistor 290 of a particular compute component 231 having a first source/drain region coupled to node ST2 and a second source/drain region coupled to node ST1. The gate of the first left-shift transistor 289 is coupled to a first left-shift control line 291 (e.g., PHASE 1L), and the gate of the second left-shift transistor 290 is coupled to a second left-shift control line 492 (e.g., PHASE 2L).

In operation, a data unit on a pair of complementary data lines (e.g., 205-1/205-2) can be loaded into a corresponding compute component 231 (e.g., by operating logical operation selection logic as described above). As an example, a data unit can be loaded into a compute component 231 via overwriting of the data unit currently stored in the compute component 231 with the data unit stored in the corresponding sense amplifier 206. Alternatively, a data unit may be loaded into a compute component by deactivating the control lines 282, 283, 291, and 292.

Once a data unit is loaded into a compute component 231, the "true" data unit is separated from the complement data unit by the first inverter 287. Shifting data to the right (e.g., to an adjacent compute component 231) can include alternating operation of the first right-shift transistor 281 and the second right-shift transistor 286, for example, via the PHASE 1R and PHASE 2R control signals being periodic signals that go high out of phase from one another (e.g., non-overlapping alternating square waves 180 out of phase). The transistor 290 can be turned on to latch the shifted data unit.

An example of shifting data left via the shift register shown in FIG. 2A can include operating control signals 291 and 292 to move a data unit one control component to the left through transistors 289 and 290. Data from node ST2 is inverted through inverter 287 to node SF1. Activation of control signal 291 causes the data from node SF1 to move left through transistor 289 to node SF2 of a left-adjacent compute component 231. Data from node SF2 is inverted through inverter 288 to node ST1. Subsequent activation of control signal 292 causes the data from node ST1 to move through transistor 290 left to node ST2, which completes a left shift by one compute component 231. Data can be "bubbled" to the left by repeating the left shift sequence multiple times. Data units can be latched (and prevented from being further shifted) by maintaining the control signal 292 activated.

Embodiments of the present disclosure are not limited to the shifting capability described in association with the compute components 231. For example, a number of embodiments can include shift circuitry in addition to and/or instead of the shift circuitry described in association with a loadable shift register.

The sensing circuitry 250 in FIG. 2A can be operated in several modes to perform logical operations, including a first mode in which a result of the logical operation is initially stored in the sense amplifier 206, and a second mode in which a result of the logical operation is initially stored in the compute component 231. Additionally with respect to the first operating mode, sensing circuitry 250 can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 206.

In a number of examples, the sense amplifier 206 and the compute component 231 can be in at least one of two states associated with the first mode and the second mode. As used herein, a state of a sense amplifier 206 and/or the compute component 231 can describe a movement (e.g., transfer) of data between the sense amplifier 206 and/or the compute component 231. The state of the sense amplifier 206 and/or the compute component 231 can also be described as whether the sense amplifier 206 and/or the compute component 231 is in an equilibration state or is storing a data unit (e.g., a binary 0 or 1 data value). For example, a sense amplifier can be configured to be in an initial state, wherein the initial state is one of an equilibration state and a data storage state.

A data storage state can include the sense amplifiers 206 storing a data unit. As used herein, a data unit can be referred to as a bit and/or a digit value. Data can be moved (e.g., transferred) from a compute component 231 to a sense amplifier 206 in response to enabling a pass gate (e.g., activating the PASS and/or PASS* control signals via the TF 262, TT 252, FT 254, and/or FF 264 control signals that are referred to herein as a logical operation selection logic) and the sense amplifier 206 being in a equilibration state. Data can be moved from a sense amplifier 206 to a compute component 231 in response to enabling the pass gate (e.g., activating the PASS and/or PASS* control signals via the TF 262, TT 252, FT 254, and/or FF 264 control signals that are referred to herein as a logical operation selection logic) and the sense amplifier 206 being in a data storage state. The direction of the movement of data between the sense amplifier 206 and the compute component 231 is determined by whether the sense amplifier 206 is in an equilibration state or stores a data unit before the PASS and/or PASS* control signals are activated and by a particular operation selected via the logical operation selection logic (e.g., TF 262, TT 252, FT 254, and FF 264 control signals).

For example, if the sense amplifier 206 is equilibrated and the PASS and/or PASS* control signals are activated to provide a conduction path (e.g., electrical continuity) between the sense amplifier 206 and the compute component 231, then a data unit stored in the compute component 231 can be moved from the compute component 231 to the sense amplifier 206.

If the sense amplifier 206 is configured to store a first bit (e.g., first data unit) and the PASS and/or PASS* control signals are activated to provide a conduction path between the sense amplifier 206 and the compute component 231, then a second bit (e.g., second data unit) that is stored in the compute component 231 before the activation of the PASS and/or PASS* control signals can be replaced by the first bit and the sense amplifier 206 retains the first bit. Furthermore, a number of operations can be performed using the first bit and the second bit using the logical operation selection logic and the result of the operation can be stored in the compute component 231.

Using an equilibration signal to direct the movement of data between the sense amplifier 206 and the compute component 231 can provide the ability to selectively perform an operation in sense amplifiers that are not equilibrated without performing the operation in sense amplifiers that are equilibrated. For example, a PASS and/or a PASS* control signal can be activated in a plurality of sensing components to move data between a first group of a plurality of sense amplifiers that are equilibrated and a first group of a plurality of compute components. The PASS and/or PASS* control signals can also be activated to move data between a second group of the plurality of sense amplifiers and a second group of the plurality of component components that are not equilibrated to selectively perform an operation in a second group of sense components while not performing the operation on a first group of sense components.

Figure 2B:
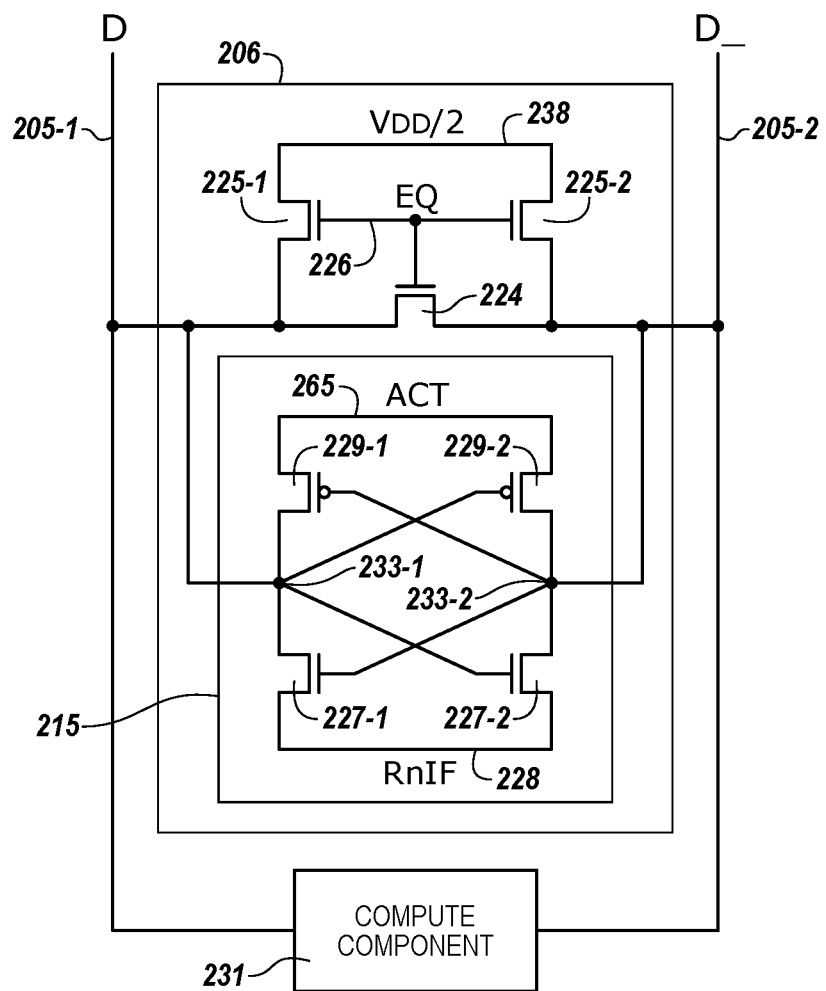

FIG. 2B illustrates a schematic diagram of a portion of sensing circuitry in accordance with a number of embodiments of the present disclosure. The portion of the sensing circuitry shown in FIG. 2B can correspond to a portion of the sensing circuitry 250 shown in FIG. 2A, for example. According to various embodiments, a sense amplifier 206 can comprise a cross coupled latch. However, embodiments of the sense amplifier 206 are not limited to a cross coupled latch. For example, the sense amplifier 206 in FIG. 2B can be current-mode sense amplifier and/or single-ended sense amplifier (e.g., sense amplifier coupled to one data line). Embodiments of the present disclosure also are not limited to a folded data line architecture.

In a number of embodiments, a sense amplifier 206 can comprise a number of transistors formed on pitch with the transistors of the corresponding compute component 231 and/or the memory cells of an array (e.g., memory array 130 shown in FIG. 1A) to which they are coupled, which may conform to a particular feature size (e.g., $4F^2$, $6F^2$, etc.). Sense amplifier 206 comprises a latch 215 including four transistors coupled to a pair of complementary data lines D 205-1 and D_ 205-2. The latch 215 can be a cross coupled latch. For example, the gates of a pair of transistors, such as n-channel transistors (e.g., NMOS transistors) 227-1 and 227-2 can be cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231, which may be referred to herein as an accumulator, can be coupled to latch inputs 233-1 and 233-2 of the cross coupled latch 215 as shown. However, embodiments are not limited to the example shown in FIG. 2B.

In this example, a second source/drain region of transistors 227-1 and 227-2 can be commonly coupled to a negative control signal (RnIF) 228. A second source/drain region of transistors 229-1 and 229-2 can be commonly coupled to an active positive control signal (ACT) 265. The ACT signal 265 can be a supply voltage (e.g., $V_{DD}$) and the RnIF signal can be a reference voltage (e.g., ground). RnIF signal 228 and ACT signal 265 can function as activating signals that enable the cross coupled latch 215.

The enabled cross coupled latch 215 can operate to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 can be coupled to an equilibration voltage 238, which can be equal to $V_{DD}/2$, where $V_{DD}$ is a supply voltage associated with the array. The gates of transistors 224, 225-1, and 225-2 can be coupled to control signal 226 (EQ). As such, activating EQ can enable the transistors 224, 225-1, and 225-2, which can effectively short data line D to data line D_ such that the data lines D and D_ are equilibrated to equilibration voltage $V_{DD}/2$. As described herein, a number of logical operations and/or shift operations can be performed using the sense amplifier 206 and compute component 231, and the result can be at least temporarily stored in the sense amplifier and/or compute component.

The sensing circuitry 250 in FIG. 2A can be operated in several modes to perform logical operations, including a first mode in which a result of the shift operation and/or logical operation is initially stored in the sense amplifier 206, and a second mode in which a result of the shift operation and/or logical operation is initially stored in the compute component 231. Additionally with respect to the first operating mode, sensing circuitry 250 can be operated in both pre-sensing (e.g., sense amplifiers fired before operation control signal active) and post-sensing (e.g., sense amplifiers fired after operation control signal active) modes with a result of a shift operation and/or logical operation being initially stored in the sense amplifier 206.

As described herein, the sense amplifier 206 can, in conjunction with the compute component 231, be operated to perform various logical operations and/or shift operations (e.g., using data from an array as input). In a number of embodiments, the result of a logical operation and/or shift operation can be stored back to the array without transferring the data via a data line address access (e.g., without firing a column decode signal such that data is transferred to circuitry external to the array and sensing circuitry via local I/O lines). As such, embodiments of the present disclosure can enable performing various operations (e.g., logical operations, shift operations, mathematical operations, etc.) that contribute to performance of, for example, compression, decompression, alpha blending, and other graphics operations using less power than various previous approaches. Additionally, because various embodiments can reduce or eliminate moving (e.g., transferring) data across I/O lines in order to perform operations (e.g., between memory and a discrete processor, which may be off pitch), such embodiments may enable an increased parallel processing capability as compared to previous approaches.

FIG. 2C shows logic tables illustrating selectable logical operation results implemented by sensing circuitry in accordance with a number of embodiments of the present disclosure. The four logic selection control signals (e.g., TF, TT, FT, and FF) described in connection with the sensing circuitry 250 shown in FIG. 2A, in conjunction with a particular data unit (e.g., sensed on the complementary sense lines), can be used to select one of a plurality of logical operations to implement involving data units in the sense amplifier 206 and/or compute component 231. The four control signals, in conjunction with the particular data unit, controls the state (conducting or not conducting) of the pass gates 207-1 and 207-2 and swap transistors 242, which in turn affects the data unit in the compute component 231 and/or sense amplifier 206 before/after firing. The capability to selectably control the state of the swap transistors 242 facilitates implementing logical operations involving inverse data units (e.g., to inverse operands and/or inverse a result of an operation), among others.

Logic Table 213-1 illustrated in FIG. 2C shows a starting data unit stored in the compute component 231 in FIG. 2A shown in column A at 244, and a starting data unit stored in the sense amplifier 206 shown in column B at 245. The other three column headings in Logic Table 213-1 refer to the state of the pass gates 207-1 and 207-2 and the swap transistors 242, which can respectively be controlled to be OPEN (e.g., conducting/on) or CLOSED (e.g., not conducting/off) depending on the state of the four logic selection control signals (e.g., TF, TT, FT, and FF), in conjunction with a particular data unit (e.g., present on the pair of complementary sense lines 205-1 and 205-2) when the ISO control signal is activated. The "Not Open" column corresponds to the pass gates 207-1 and 207-2 and the swap transistors 242 both being in a non-conducting condition, the "Open True" corresponds to the pass gates 207-1 and 207-2 being in a conducting condition, and the "Open Invert" corresponds to the swap transistors 242 being in a conducting condition. The configuration corresponding to the pass gates 207-1 and 207-2 and the swap transistors 242 both being in a conducting condition is not reflected in Logic Table 213-1 because this can result in the sense lines being shorted together.

The logic tables illustrated in FIG. 2C can reflect a result initially stored in the compute component 231 in FIG. 2A. Therefore, when the pass gates 207-1 and 207-2 are controlled to be CLOSED (e.g., not conducting), the result initially stored in the compute component 231 is the same as the starting data unit in the compute component 231. However, because the sense sensing circuitry 250 is configured such that the sense amplifier 206 can overpower the compute component 231, as shown in the "Not Open" column 256 of the Logic Table 213-1, the result initially stored in the compute component 231 is the same as the starting data unit in the sense amplifier 206 when the pass gates 207-1 and 207-2 are controlled to be OPEN (e.g., conducting) as shown in the "Open True" column 270 of the Logic Table 213-1. The compute component 231 can be inverted as shown in the "Open Invert" column 271 when the swap transistors 242 are in a conducting condition.

Via selective control of the state of the pass gates 207-1 and 207-2 and the swap transistors 242, each of the three columns of the upper portion of Logic Table 213-1 can be combined with each of the three columns of the lower portion of Logic Table 213-1 to provide 3×3=9 different result combinations, corresponding to nine different logical operations, as indicated by the various connecting paths shown at 275. The nine different selectable logical operations that can be implemented by the sensing circuitry 250 are summarized in Logic Table 213-2 illustrated in FIG. 2C.

The columns of Logic Table 213-2 illustrated in FIG. 2C show a heading 280 that includes the state of logic selection control signals. For example, the state of a first logic selection control signal is provided in row 276, the state of a second logic selection control signal is provided in row 277, the state of a third logic selection control signal is provided in row 278, and the state of a fourth logic selection control signal is provided in row 279. The particular logical operation corresponding to the results is summarized in row 247.

For example, the results for the values of FF, FT, TF, and TT of "0000" are summarized as "A" because the result (initially stored in the compute component after the sense amplifier fires) is the same as the starting value in the compute component. Other columns of results are similarly annotated in row 247, where "A*B" intends A AND B, "A+B" intends A OR B, and "AXB" intends A XOR B. By convention, a bar over a data unit or a logical operation indicates an inverted value of the quantity shown under the bar. For example, AXB bar intends not A XOR B, which is also A XNOR B.

Figure 3:
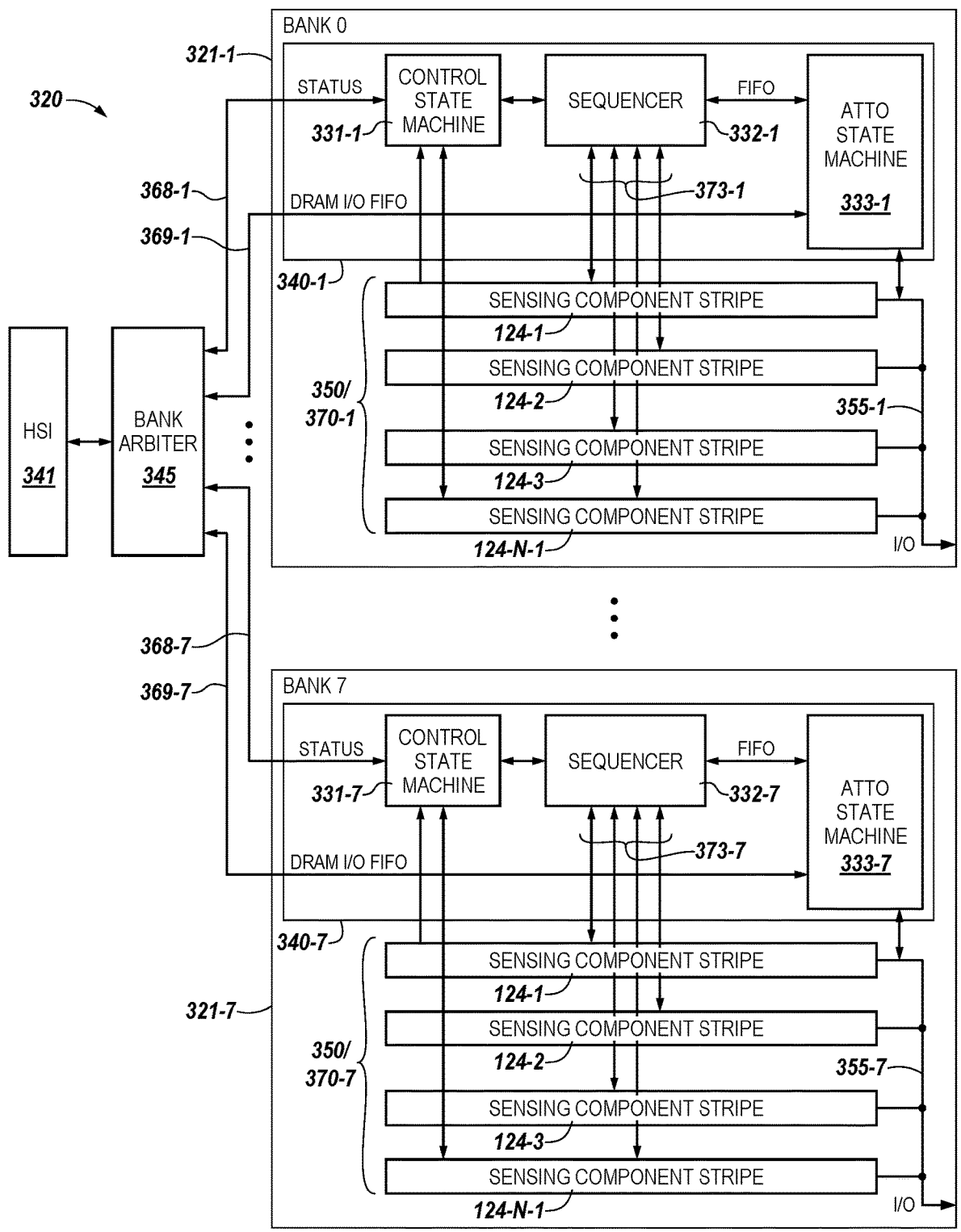
FIG. 3 is a block diagram of a memory device in accordance with a number of embodiments of the present disclosure.

FIG. 3 is a block diagram of a memory device 320 in accordance with a number of embodiments of the present disclosure. The memory device 320 shown in FIG. 3 has PIM capabilities, as described in connection with memory devices 120 shown in FIGS. 1A and 1B and sensing circuitry 250 in FIGS. 2A-2C.

As shown in FIG. 3, a HSI 341 may be coupled to a bank arbiter 345 in the PIM device 320. In various embodiments the HSI 141 may be configured to receive commands and/or data from a host 110, as described in connection with and shown in FIGS. 1A and 1B. Alternatively or in addition, the HSI 341 may receive commands and/or data from a channel controller 143 via an address/control (A/C) bus 154, a data bus 156, and/or an OOB bus 157 as illustrated in FIGS. 1A-1C. In various embodiments, the bank arbiter 345 may be coupled to a plurality of banks 321-1, . . . , 321-7 including associated arrays 130 and registers.

In the example of FIG. 3, each bank 321-1, . . . , 321-7 may be configured with a respective controller 340-1, . . . , 340-7. The controllers 340-1, . . . , 340-7 may represent one or more portions of the controller 140 described in connection with FIG. 1A. According to the example embodiment shown in FIG. 3, each controller 340-1, . . . , 340-7 may comprise respective control logic (e.g., control state machines) 331-1, . . . , 331-7, a sequencer 332-1, . . . , 332-7, and an atomic state machine (Atto state machine) 333-1, . . . , 333-7.

In some embodiments, the control logic 331-1, . . . , 331-7 may be responsible for fetching machine instructions (e.g., microcode instructions) from an array of memory cells (e.g., a DRAM array) in each bank 321-1, . . . , 321-7. The control logic 331-1, . . . , 331-7 may decode the microcode instructions into calls (e.g., microcode functions), implemented by the sequencers 332-1, . . . , 332-7. The microcode functions can be the operations that the sequencers 332-1, . . . , 332-7 receive and operate on to cause the PIM device 320 to perform particular operations, which may include the operations described herein.

For example, the control logic 331 can fetch machine instructions, which when executed, direct performance of operations by the intelligent frame buffer comprising the sensing circuitry 150 (e.g., sensing component stripes 124-0, . . . , 124-N−1 in FIG. 1C). The sensing circuitry 150 may, in some embodiments, be on pitch with sense lines (e.g., formed to fit within the 3F pitch of pairs of complementary sense lines 205-1 and 205-2 in FIG. 2B) of the subarrays (e.g., 125-0, 125-1, . . . , 125-N−1 in FIG. 1C) in each bank 321-1, . . . , 321-7. The sensing circuitry 150 may, in some embodiments, be on chip with (e.g., formed on the same chip as the memory cells in the array) the operations component 172 associated with the controller 340. In some embodiments, the operations component 172 can be part of the controller 340, such that the operations component 172 and/or the controller 340 can be configured to execute the received machine instructions (e.g., fetched by the control logic 331). Operations performed based on execution of the machine instructions can, as described herein, include data compression and/or decompression, alpha blending, rescaling, depth texturing operation, and/or depth buffering, among others.

The Atto state machines 333-1, . . . , 333-7 may provide timing and be responsible for providing conflict free access to the arrays. In some embodiments, the sequencers 332-1, . . . , 332-7, and atomic state machines (Atto state machines) 333-1, . . . , 333-7 may be state machines and the control logic 331-1, . . . , 331-7 may be a very large instruction word (VLIW) type processing resource (e.g., containing a program counter, instruction memory, etc.)

For example, operations may be received to and operated on by the sequencers 332-1, . . . , 332-7 to cause sensing circuitry 250 shown in FIGS. 2A-2C to perform an operation, such as addition, multiplication, etc., and/or, as a more specific example, a Boolean logical operation, such as an AND, OR, XOR, etc., operation, which can be utilized in performance of the operations on images, for example, as described herein. In this manner, performance of operations and/or execution of corresponding instructions are occurring on a bank 321-1, . . . , 321-7 of a PIM device 320, which are more complex than traditional DRAM read and write operations. Such operations, however, may additionally comprise DRAM operations, such as a read, write, copy, and/or erase operations, etc. As described in connection with FIGS. 1A-1C, the controllers 340-1, . . . , 340-7 may be coupled to sensing circuitry 350 and/or logic 370, including cache, buffers, sense amplifiers, extended row address (XRA) latches, and/or registers, associated with arrays of memory cells via control lines and data paths 355. For example, sensing circuitry 350 and logic 370 can further be associated to the arrays of memory cells via data I/O lines shown as 355-1, . . . , 355-7.

In some embodiments, the sequencers 332-1, . . . , 332-7 may generate sequences of operation cycles for a DRAM array. For example, each sequence may be designed to perform operations, such as a Boolean logic operation (AND, OR, XOR, etc.), which together achieve a specific function, such as repetitively calculating the logic equations for a one (1) bit add in order to calculate a multiple bit sum. Each of these operations may be fed into a first in/first out (FIFO) buffer provided by the Atto state machines 333-1, . . . , 333-7 for providing timing coordination with the sensing circuitry 350 and/or logic 370 associated with the array of memory cells (e.g., DRAM arrays).

In the example embodiment shown in FIG. 3, the Atto state machines 333-1, . . . , 333-7 provide timing and are responsible for providing conflict free access to the arrays from a number of FIFO queues. As such, in at least one embodiment, the Atto state machines 333-1, . . . , 333-7 include timing circuitry coupled to the array and sensing circuitry (e.g., sensing component stripes 124-0, . . . , 124-N−1 coupled to subarrays 125-0, 125-1, . . . , 125-N−1) and the timing circuitry is configured to control timing of operations for the sensing circuitry. For example, one FIFO queue 368 may support receipt and processing of PIM operations via a control state machine 331-1, a sequencer 332-1, and/or an Atto state machine 333-1, one FIFO queue 373 may be for instruction fetch and/or for microcode instruction fetch (e.g., from subarrays 125-0, 125-1, . . . , 125-N−1 via respective sensing component stripes 124-0, 124-1, . . . , 124-N−1), and one FIFO queue 369 may be for I/O of DRAM operations. In various embodiments, both the control logic 331-1, . . . , 331-7 and the sequencers 332-1, . . . , 332-7 may generate status information, which can be routed back to the bank arbiter 345 via a FIFO interface (e.g., 368-1, . . . , 368-7). The bank arbiter 345 may aggregate this status data and report it back to a channel controller, such as a channel controller 143 associated with host 110, via the HSI 341.

As described herein, an operations component 172 (e.g., in combination with the controller 140) can direct that data values from a selectable row 119 of a selectable subarray 125 be at least temporarily stored (cached) in a sensing component stripe 124 coupled to that subarray and that a number of operations be performed on at least one of the data values in the sensing component stripe 124 by the sense amplifier 206 and/or the compute component 231. The operations component 172 can direct that these data values be subsequently returned for storage in the memory cells of the same or a different row of the subarray and/or that these data values be subsequently moved (e.g., via a shared I/O line) to selectably coupled sensing circuitry 150 (e.g., in a different sensing component stripe 124) for further processing (e.g., operations) to be performed on the data values.

As described herein, the operations component 172 can be selectably coupled to the sensing circuitry 150 of the plurality of subarrays. The operations component can, in various embodiments, be configured to direct performance of an operation by the sensing circuitry with respect to data stored in a selectable subarray of the respective plurality of subarrays. As such, the memory device can be configured to, as described herein, store a data value as received from a source (e.g., store a data set before an operation has been performed on the data) in a memory cell in a row of the selectable subarray (e.g., store at least part of the data set in the row). The memory device can be further configured to output the data value to an output processing component 171 (e.g., an I/O processing component to perform CPU/GPU type functions) associated with a controller subsequent to performance of the operation thereon in the sensing circuitry, as directed by the operations component 172.

In some embodiments, the controller with which output processing component 171-1 is associated may be a controller 140 for a bank 121 of the respective plurality of subarrays, as shown in FIG. 1A. In some embodiments, the controller with which output processing component 171-2 is associated may be a channel controller 143 associated with a plurality of banks of the respective plurality of subarrays and/or a plurality of memory devices, as shown in FIG. 1B. The channel controller 143 may be associated with a host 110 coupled to the memory device 120-1 and/or a plurality of memory devices 120-1, . . . , 120-N that each include banks 121-0, . . . , 121-N of the respective plurality of subarrays.

The memory device can be configured to receive (e.g., store) a plurality of compressed data values, as received from the source, to the selectable subarray. In various embodiments, the compressed data values can be from a compressed video recording having a number of video images, a compressed static image, and/or a compressed audio file, as described herein, among other possibilities. The memory device can be configured, in some embodiments, to decompress, as directed by the operations component, a plurality of the compressed data values, as received from the source to the selectable subarray, prior to performance of the operation thereon (e.g., prior to performance of an operation other than the decompression).

The memory device can be configured, in some embodiments, to perform an alpha blending operation, as directed by the operations component, on a plurality of data values as received from the source to (e.g., stored in) the selectable subarray. The memory device can be configured, in some embodiments, to perform a rescale operation, as directed by the operations component, on a plurality of resized data values received from the source to the selectable subarray.

The memory device can be configured, in some embodiments, to perform a depth texturing operation, as directed by the operations component, on a plurality of data values received from the source to the selectable subarray. A depth texture, also known as a shadow map, as used herein is intended to mean a texture that contains data from a depth buffer for a particular image. Each pixel value may contain a depth of the geometry in that pixel. A depth texture may be used to render appropriate shadows in the image. A depth texturing operation may be used to adjust the shadows that indicate image depth.

The memory device can be configured, in some embodiments, to perform a depth buffering operation, as directed by the operations component, on a plurality of data values received from the source to the selectable subarray. Depth buffering, also known as z-buffering, as used herein is intended to mean management of image depth coordinates in a three-dimensional graphics context. Depth buffering can be used to affect visibility, by determining which elements of a rendered image are visible and which are hidden. When an image is rendered, the depth of a generated pixel can be stored in a buffer (e.g., the z-buffer and/or a depth buffer). If a second object of the image is to be rendered in the same pixel, the depths of the two objects can be compared and one object can override the other object in the pixel based on which object is closer to an observer. For example, depth buffering may allow an image to appropriately reproduce depth perception where a close object can hide an object that is farther away. In addition, depth buffering may allow rendering a surface from a point of view of a light source through adjusting of shadows by the depth texturing technique.

In some embodiments, the alpha blending operation, the rescale operation, the depth texturing operation, and/or the depth buffering operation, among other possible operations, can be performed on a plurality of data values decompressed, as directed by the operations component, from compressed data values received from the source to the selectable subarray. The operations component can be further configured to direct storage of data values to a selectable subarray after decompression and a second operation (e.g., alpha blending, among possible others) have been performed thereon. In various embodiments, the selectable subarray for storage may be the same selectable subarray to which the data values were originally stored or a different selectable subarray.

The source that provides the data values to the selectable subarrays may, in some embodiments, be a controller 140 for a bank 121 of the respective plurality of subarrays, as shown in FIG. 1A. In some embodiments, the source may be a channel controller 143 associated with a plurality of banks of the respective plurality of subarrays and/or a plurality of memory devices, as shown in FIG. 1B. The channel controller 143 may be connected to the host 110 coupled to the memory device and/or a plurality of memory devices that include banks of the respective plurality of subarrays.

A host may be selected from a group of devices that can provide data suitable for digital processing, as described herein. As such, the host may, for example, be a personal laptop computer, a desktop computer, a tablet computer, a digital camera, a smart phone, a memory card reader, a digital versatile disc player, a JPEG compressed image, a MPEG compressed audio recording, a MPEG compressed video recording, and/or an audio input, among various other types of hosts.

As such, the memory device can be configured to receive a plurality of data values from a source, where each of the plurality of data values can be received to (e.g., stored by) at least one selectable subarray in the respective plurality of subarrays. The memory device also may be configured to output the plurality of data values to an output processing component 171-1 and/or 171-2 associated with a controller subsequent to performance of an operation thereon, as directed by the operations component 172 (e.g., using instructions stored in the operations component).

The memory device can be configured to receive the data values from an input processing component 171-1 and/or 171-2. The I/O processing component 171-1 and/or 171-2 may be associated with a controller 140 for a bank, or a channel controller 143 associated with a plurality of banks, a plurality of memory devices, and/or a host. The input processing component 171-1 and/or 171-2 can be configured to perform various CPU/GPU type functions (operations), including to select a row of the selectable subarray for storage of the data values inputted from the source to the selectable subarray. The plurality of data values can be stored (cached) in at least one selectable sensing component stripe (e.g., 124) coupled to at least one selectable subarray. As such, the plurality of data values can be stored in at least one selectable row of the at least one selectable subarray.

The memory device can be configured to receive the data values from an input processing component 171-1 and/or 171-2 configured to compress the data values to correspond to a storage capacity of (e.g., a number of memory cells in) a selected row of the selectable subarray. For example, in a video and/or audio file having more than 16,384 data values (bits), a compression algorithm may be directed and/or performed to compress the data in the video and/or audio file to fit a row of a subarray with 16,384 memory cells. The compressed data values may be sent into (e.g., stored in) the selected row. In some embodiments, the compression and/or sending of the data values may be directed by the operations component 172 described herein.

In some embodiments, the input processing component 171-1 and/or 171-2 may be separate from a memory device 120 and/or a bank 121 that includes an array of memory cells 130. For example, the input processing component 171-1 and/or 171-2 may not be on pitch and/or on chip with the array of memory cells 130 and may be associated with and/or part of the host 110 or a separate component.

As described herein, the operations component 172 can be configured to store a set of instructions to direct the performance of the operation by the sensing circuitry with respect to the data stored in the selectable subarray of the respective plurality of subarrays. The operations component can be configured to direct the sensing circuitry in a sensing component stripe (e.g., 124) to perform the operation. The sensing circuitry can include a sense amplifier and/or a compute component (e.g., 206 and 231, respectively, in FIG.

2) coupled to each of the sense lines. The sensing circuitry can be included in a plurality of sensing component stripes and each sensing component stripe can be physically associated with a respective subarray of the respective plurality of subarrays in the bank.

The circuitry described herein is configured such that the operation performed in the sensing component stripe can be a first operation performed on the data value subsequent to storage of the data value in the selected row of the selectable subarray. The operations component 172 can be configured to move a data value (e.g., via a shared I/O line) corresponding to a result of an operation with respect to data stored in a first selectable subarray of the respective plurality of subarrays to a memory cell in a row of a second selectable subarray of the respective plurality of subarrays.

As such, the operations component can be configured to direct performance of a first operation by the sensing circuitry of the first subarray with respect to data values stored in the first subarray and direct performance of a second operation by the sensing circuitry of a second subarray with respect to data values stored in the second subarray. The first and second operations can be at least part of a sequence of operations. In some embodiments, the second operation can be different than the first operation (e.g., in a sequence of operations). The operations component can be configured to execute a first set of instructions to direct performance of the first operation and execute a second set of instructions to direct performance of the second operation. The sensing circuitry can be configured to couple to the respective plurality of subarrays to implement parallel movement of data values stored in a first subarray, upon which a first operation has been performed, to a plurality of memory cells in a second subarray. In various embodiments, the memory device can include a plurality of I/O lines shared by the respective plurality of subarrays and configured to couple to the sensing circuitry of a first subarray and a second subarray to selectably implement parallel movement of a plurality of data values stored in the first subarray, upon which a first operation has been performed, to a plurality of memory cells in the second subarray.

The apparatus can include a bank arbiter (e.g., as shown at 145 and described in connection with FIGS. 1A and 1B). The bank arbiter 145 can be configured to receive a set of instructions from the host 110 to perform an operation or sequence of operations (e.g., on a received static image, video image, and/or audio file, among others). The bank arbiter can pass command instructions to execute the set of instructions to an operations component and/or controller in at least one of a plurality of banks. The bank arbiter 145 can aggregate status of the execution of the set of instructions to report back to a channel controller 143 of the host, where the status can include a status of the output of the data values on which the operation(s) has been performed from at least one sensing component stripe in the plurality of banks (e.g., to be stored in at least one subarray and/or output to a combined data bus of at least one of the plurality of banks).

As described herein, the memory device can include a sensing component stripe (e.g., 124) configured to include a number of a plurality of sense amplifiers and compute components that corresponds to a number of the plurality of columns of the memory cells (e.g., where each column of memory cells is coupled to a sense amplifier and a compute component). The number of a plurality of sensing component stripes in the bank section (e.g., 124-0 through 124-N−1) can correspond to a number of a plurality of subarrays in the bank section (e.g., 125-0 through 125-N−1).

As described herein, an array of memory cells can include a column of memory cells having a pair of complementary sense (digit) lines (e.g., 205-1 and 205-2 in FIG. 2A). The sensing circuitry can, in some embodiments, include a sense amplifier (e.g., 206) selectably coupled to each of the pair of complementary sense (digit) lines and a compute component (e.g., 231) coupled to the sense amplifier via pass gates (e.g., 207-1 and 207-2).

An operation performed in the sensing circuitry 150 of the intelligent frame buffer may, in some embodiments, be a first operation performed on the data value subsequent to storage of the data value in the selected row of the selectable subarray. The operation performed in the sensing circuitry 150 of the intelligent frame buffer may be at least a second operation (e.g., second, third, fourth, etc.) performed on the data value subsequent to storage of the data value in the selectable subarray. For example, the first operation may have been decompression performed on the data by the sensing circuitry in a sensing component stripe of a selectable subarray and the second operation may be a different operation (e.g., alpha blending, among other possible operations) performed on the decompressed data.

The controller 140 can be configured to provide a set of instructions to the operations component to direct performance of a number of operations with respect to data stored in the selectable subarray of the respective plurality of subarrays. In some embodiments, the host 110, as described herein, can provide the data to the controller for the controller, in combination with the operations component 172, to issue the commands for operations using compressed and decompressed data.

Embodiments described herein provide a method for operating a memory device 120 to implement the operations using compressed and decompressed data. The operations may be performed by execution of non-transitory instructions (e.g., from operations component 172) by a processing resource (e.g., sensing circuitry 150 in sensing component stripes 124-0, 124-1, . . . , 124-N−1). The method can include storing data, as received from a source, as data values in a selected row of a selected subarray (e.g., in one or more rows selected in any one of, any combinations of, or all of subarrays 125-0, . . . , 125-N−1, for example) of the memory device and performing a digital processing operation on the data values, as directed by an operations component 172 coupled to the selected subarray. The data values can be output to an output processing component 171-1 and/or 171-2 associated with a controller subsequent to performance of the digital processing operation thereon, as directed by the operations component.

As described herein, the method can include receiving (e.g., in parallel via a number of I/O lines) the data values to (e.g., storing the data values in) either a sensing component stripe (e.g., 124) and/or a row (e.g., 319) of the selected subarray. The data values can be stored as at least two thousand bits (e.g., prior to performing an operation thereon). Storing a file size of at least two thousand bits, corresponding to some or all of the number of memory cells (e.g., 16,384) in a row of a subarray, as described herein, may be too many bits for a cache save for processing in a GPU associated with a host.

The method can further include compressing the received data values (e.g., in an image frame or a plurality of received image frames) to a number of bits that corresponds to a number of sense amplifiers and/or compute components in a sensing component stripe and/or a number of memory cells in a row of the selected subarray. In some embodiments, a compressed image frame can be stored as received from the source. The compressed image frame can be decompressed, as directed by the operations component, and the digital processing operation can be performed on the decompressed data values, as directed by the operations component.

The method can further include receiving (e.g., at least temporarily storing and/or caching) the data values (e.g., as received either from the source or as sensed from the selected subarray) to a sensing component stripe coupled to the selected subarray. In some embodiments, the digital processing operation can be performed on the data values by sensing circuitry in the sensing component stripe, as directed by the operations component. The method can further include performing the digital processing operation on the data values in the sensing component stripe coupled to the selected subarray either as received from the source or as sensed from the selected subarray.

For example, the method can include receiving the data values to (e.g., storing the data values in) a sensing component stripe selectably coupled to the selected subarray and performing the operation on the data values using the sensing circuitry in the sensing component stripe, as directed by the operations component. Alternatively, the method can include receiving the data values to a selected row of the selected subarray, moving the data values from the selected row to the sensing component stripe selectably coupled to the selected row, and performing the operation on the data values using sensing circuitry in the sensing component stripe. In some embodiments, the sense amplifiers and/or compute components of the sensing component stripe may be formed on pitch with the selected subarray and/or the selected row (e.g., the corresponding pairs of complementary sense lines thereof). The data values can be received to (e.g., stored in) a selected subarray of the memory device subsequent to performance of the digital processing operation thereon (e.g., in the sensing component stripe) and prior to outputting the data values to the output processing component 171-1 and/or 171-2.

The method can further include receiving the data values from the source (e.g., a source device). The source device can, in various embodiments, be a controller 140 for a bank 121 of a plurality of subarrays and/or a channel controller 143 that is associated with a plurality of banks (e.g., 121-1, 121-2, ..., 121-N) of the respective plurality of subarrays and/or is connected to a host 110 coupled to the memory device. In some embodiments, the source can be on chip with the sensing circuitry 150 and memory 130 described herein. For example, the source may be a controller 140 for a bank 121 of a respective plurality of subarrays 125, as shown in FIGS. 1A-1C and not a GPU associated with the host that already processes the image frame before it is sent to and/or stored in the selected subarray. The plurality of data values stored in the selectable subarray as received from the source can, in various embodiments, include data values from a static image, data values of a video image, and/or a plurality of audio data values, among many other possibilities.

While example embodiments including various combinations and configurations of controllers, operations components, sensing circuitry, sense amplifiers, compute components, and/or sensing component stripes, etc., have been illustrated and described herein, embodiments of the present disclosure are not limited to those combinations explicitly recited herein. Other combinations and configurations of the controllers, operations components, sensing circuitry, sense amplifiers, compute components, and/or sensing component stripes, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving, from a host external to a memory device, compressed data by sensing circuitry coupled to an array of memory cells of the memory device;
   configuring a sense amplifier, a compute component, and logical operation selection logic of the sensing circuitry to read data stored by the array, write data to the array, and decompress data;
   storing the compressed data in selected memory cells of the array;
   directing, by an operations component programmed for performance of bitwise logical operations selected from the logical operation selection logic, performance of a decompression operation on the compressed data to produce decompressed data;
   performing the decompression operation on the compressed data, using the sensing circuitry selectably coupled to the selected memory cells and as directed by the operations component, to produce the decompressed data,
   wherein performing the decompression operation on the compressed data comprises:
      decompressing the compressed data without transferring data values associated with performance of the decompression operation on the compressed data to a processing component external to the sensing circuitry;
      providing signaling, in association with performance of the decompression operation on the compressed data, to a first pair of signal lines of the logical operation selection logic and a second pair of transistors coupled to a second pair of signal lines of the logical operation selection logic to select a number of logical operations to be performed on the compressed data in association with performance of the decompression operation on the compressed data; and directing, by the operations component, performance of the number of logical operations on the compressed data using the compute component, wherein the compute component operates as an one-bit processing element; and performing, by the sensing circuitry, alpha blending and compositing operations on data values of the decompressed data.

2. The method of claim 1, further comprising performing, by the sensing circuitry as further directed by the operations component, a subsequent operation on the decompressed data including performing a different number of logical operations by the compute component without transferring the decompressed data to the processing component external to the sensing circuitry.

3. The method of claim 1, further comprising decompressing the compressed data using a portion of the sensing circuitry that is on pitch with the selected memory cells.

4. The method of claim 1, further comprising performing a logical operation on the decompressed data by the sense amplifier coupled to the compute component.

5. The method of claim 1, further comprising performing, by the sensing circuitry, a rescale operation on data values of the decompressed data.

6. The method of claim 1, further comprising performing, by the sensing circuitry, depth texturing on data values of the decompressed data.

7. The method of claim 1, further comprising performing, by the sensing circuitry, depth buffering on data values of the decompressed data.

8. A system, comprising:
a host configured to generate instructions;
a memory device coupled to the host and comprising:
an array of memory cells; and
sensing circuitry configured to:
read data stored by the array;
write data to the array;
decompress data; and
perform alpha blending and compositing operations on data values of the decompressed data,
wherein the memory device is configured to execute instructions received from the host to cause:
compression of data values, by an input processing component of a controller of the memory device, wherein the input processing component is configured to compress the data values to correspond to a storage capacity of a number of memory cells of a selected row of the memory device;
signaling, associated with performance of a decompression operation on the compressed data values, to be provided to a first pair of transistors coupled to a first pair of signal lines of logical operation selection logic of the sensing circuitry and a second pair of transistors coupled to a second pair of signal lines of the logical operation selection logic to select a number of bitwise logical operations to be performed in association with performance of the decompression operation on the compressed data values;
a compute component of the sensing circuitry selectably coupled to the selected row to perform the number of bitwise logical operations on the compressed data values, as directed by an operations component selectably coupled to the sensing circuitry, to perform the decompression operation on the compressed data values to produce the decompressed data values,
wherein the decompression operation is performed on the compressed data without transferring data values associated with performance of the decompression operation on the compressed data values to a processing component external to the sensing circuitry;
performance of a different bitwise logical operation, selected by the logical operation selection logic, on the decompressed data values using the compute component; and
a result of the different bitwise logical operation to be written to the selected row prior to outputting the result to an output processing component of the memory device.

9. The system of claim 8, wherein the memory device is further configured to receive the compressed data values as at least two thousand bits of data in parallel to a sensing component stripe comprising the sensing circuitry.

10. The system of claim 8, wherein the compressed data values are compressed to a quantity of bits equivalent to a quantity of sense amplifiers or compute components of the sensing circuitry corresponding to the storage capacity of the number of memory cells of the selected row.

11. The system of claim 8, wherein the memory device is further configured to:
receive a compressed image frame via a controller selectably coupled to the host;
cause decompression of the compressed image frame, as directed by the operations component; and
cause performance of the different bitwise logical operation on data values associated with the decompressed image frame, as directed by the operations component.

12. The system of claim 8, wherein the memory device is further configured to:
receive the data values via a sensing component stripe selectably coupled to a selected subarray of the memory device; and
cause performance of the different bitwise logical operation on the data values by the sensing circuitry of the sensing component stripe, as directed by the operations component.

13. The system of claim 8, wherein the memory device is further configured to:
cause the compressed data values to be written to the selected row of a selected subarray;
cause the data values to be transferred from the selected row to a sensing component stripe selectably coupled to the selected row; and
cause performance of the different bitwise logical operation on the data values by the sensing circuitry of the sensing component stripe, as directed by the operations component.

14. An apparatus, comprising:
an array of memory cells of a memory device;
sensing circuitry selectably coupled to the array and including:
a sense amplifier;
a compute component; and
logical operation selection logic,
wherein the sensing circuitry is configured to:
read data stored by the array, write data to the array, and decompress data;
receive compressed data values from a host external to the array;
perform, in association with performance of a decompression operation on the compressed data values, a bitwise logical operation, using the compute component, on the compressed data values to produce decompressed data values; and perform alpha blending and compositing operations on the decompressed data values; and an operations component selectably coupled to the sensing circuitry to direct performance of the bitwise logical operation by the compute component; and wherein the apparatus is configured to:

store the compressed data values to a selected subarray of the array;

provide, in association with performance of the decompression operation on the compressed data values, signaling to a first pair of transistors coupled to a first pair of signal lines of the logical operation selection logic and a second pair of transistors coupled to a second pair of signal lines of the logical operation selection logic to select the bitwise logical operation;

cause the compute component to perform the bitwise logical operation, in association with performance of the decompression operation on the compressed data values and as directed by the operations component, without transferring data values associated with performance of the decompression operation on the compressed data to a processing component external to the sensing circuitry; and output the decompressed data values from the sensing circuitry.

15. The apparatus of claim 14, further comprising an input processing component coupled to the array and configured to:

compress a plurality of data values to correspond to a storage capacity of a selected row of the selected subarray; and send the compressed data values into the selected row.

16. The apparatus of claim 14, wherein the operations component is further configured to direct performance of the bitwise logical operation, by the sensing circuitry, on the compressed data values stored by the selected subarray.

17. The apparatus of claim 14, wherein the operations component is further configured to:

direct decompression of the compressed data values via performance of the bitwise logical operation by the sensing circuitry; and direct performance of the alpha blending and compositing operations on the decompressed data values in the sensing circuitry.

18. The apparatus of claim 14, further comprising a controller including the operations component and configured to execute machine instructions.

* * * * *